United States Patent [19]
Liang

[11] Patent Number: 5,702,988
[45] Date of Patent: Dec. 30, 1997

[54] BLENDING INTEGRATED CIRCUIT TECHNOLOGY

[75] Inventor: Mong-Song Liang, Hsin-Chu, Taiwan

[73] Assignee: Taiwan Semiconductor Manufacturing Company, Ltd., Hsin-Chu, Taiwan

[21] Appl. No.: 641,767

[22] Filed: May 2, 1996

[51] Int. Cl.$^6$ ................................................. H01L 21/8242
[52] U.S. Cl. ........................... 438/238; 438/253; 438/257; 438/258; 438/199
[58] Field of Search .................................. 438/238, 253, 438/257, 258, 199

[56] References Cited

U.S. PATENT DOCUMENTS

| | | | |
|---|---|---|---|
| 5,066,602 | 11/1991 | Takemoto et al. | 437/31 |
| 5,252,504 | 10/1993 | Lowrey et al. | 438/253 |
| 5,258,096 | 11/1993 | Sandhu et al. | 438/253 |
| 5,340,762 | 8/1994 | Vora | 437/52 |
| 5,547,893 | 8/1996 | Sung | 438/253 |

OTHER PUBLICATIONS

S. Wolf, "Silicon Processing for the VLSI Era–vol. 2" Lattice Press, Sunset Beach, CA, pp. 571–572, 1990.

*Primary Examiner*—Jey Tsai
*Attorney, Agent, or Firm*—George O. Saile; Stephen B. Ackerman

[57] ABSTRACT

A method of forming semiconductor logic devices and memory devices on a single semiconductor substrate is described. Memory devices that may be formed include nonvolatile memory, DRAM and/or SRAM (poly-load or TFT). A semiconductor substrate having a first conductivity type dopant is provided. A triple-well structure is formed in the semiconductor substrate, having N-well regions, P-well regions, and P-well in N-well regions. Field isolation regions are formed. A cell is formed for each memory device in the memory regions. A channel implant is performed in the substrate for each of the logic and memory devices. A primary gate and gate oxide is formed for each of the logic and memory devices. LDD (Lightly Doped Drain) active regions and heavily doped source/drain regions are formed adjacent to each gate. Additional memory structures are formed, such as a DRAM capacitor. An interlevel dielectric and contact openings therein are formed. One or more metal layers are subsequently deposited over the inter-level dielectric layer and in the openings to make contact to the contact regions.

55 Claims, 21 Drawing Sheets

BLENDING INTEGRATED CIRCUIT TECHNOLOGY

RELATED PATENT APPLICATIONS

"Method of Making a Semiconductor Device having 4T SRAM and Floating Gate Memory", Ser. No. 08/654,131, file date May 25, 1996, U.S. Pat. No. 5,605,85 assigned to common assignee.

"Method of Making a Semiconductor Device having 4T SRAM and Mixed Mode in Logics", Ser. No. 08/654,498, filed date May 28, 1996, assigned to common assignee.

"Method of Making a Semiconductor Device having High Density SRAM in Logic with Salicide Process", Ser. No. 08/654,467, filed date May 25, 1996, assigned to common assignee.

BACKGROUND OF THE INVENTION

1. Field of the Invention

This invention relates to semiconductor manufacturing, and more particularly to a method of integrating various types of semiconductor memories with logic, or with other memory devices, on the same integrated circuit (IC).

2. Description of the Related Art

Two of the two major classes of devices manufactured by the semiconductor industry are logic and memory. Logic devices are used primarily to process information, while memory devices are used for information storage. Traditionally, while both device types are found in many electronic systems, such as computers and the like, they have been manufactured on separate integrated circuits and connected only at the card or board level. This has been due to differences in manufacturing processes, cost considerations, economies of scale, and other difficulties in fabricating the different device structures on the same substrate.

However, trends in the semiconductor industry are driving toward making it both desirable and feasible to blend memories and logic on the same integrated circuit (IC). Cost and performance are two of the factors contributing to these trends. While significant economies of scale can be realized by the separate batch processing of large numbers of semiconductor wafers for the two types of device, due to the different process steps needed to produce them, cost savings may also be realized by forming logic and memories on the same integrated circuit. An important example of such cost savings can be seen by the following analysis of yield, i.e., the ratio of good IC's to the total number produced.

Using the Poisson yield model, yield Y is given by the equation:

$$Y = e^{-A*D} \quad (1)$$

where A=chip area, and D=defect density. As shown in FIG. 1, a given memory IC 2 has a yield Y1 determined by its area A1 and defect density D1, and a logic IC 4 has a yield Y2 determined by its area A2 and its defect density D2, so that $$Y1 = e^{-A1*D1} \quad (2)$$

$$Y2 = e^{-A2*D2} \quad (3)$$

IC's 10 and 12 are depictions of the prior art in which the logic and memory are formed on separate integrated circuits. Embedded chip 6, in which the logic and memory devices are combined on one IC, has an area A given by the equation:

$$A = (A1 = A2)*n \quad (4)$$

where n=the reduction in area due to combining logic and memory, mainly due to the elimination of I/O (Input/Output pins, wiring, etc.).

The best case yield for the embedded IC 6 is:

$$Y = \text{minimum}(Y1, Y2) \quad (5)$$

whereas the worst case yield would be:

$$Y = Y1*Y2, \quad (6)$$

or $$Y = e^{-n(A1+A2)*D} \quad (7)$$

where $D=(D1*A1+D2*A2)/n(A1+A2)$. The integration of logic and memory structures on the embedded IC 6 can provide an overall yield improvement primarily due to the reduced area factor n.

Performance enhancements may also make blending logic and memories on the same IC attractive for particular applications. In electronic systems in which logic and memory are packaged separately, data signals between the two may have to pass through several levels of packaging, i.e., through the originating IC chip to external pins, then through card and/or board wiring, and finally into the receiving IC including its internal wiring, all of which cause undesirable propagation delays. As device densities have increased and device sizes have decreased, transistor switching speeds no longer limit the logic delay or access time of the IC. Rather, the time for the device to charge capacitive loads is the limiting factor for IC performance. The capacitive load is partially dependent on the length of lines interconnecting devices, and so minimizing these connection lengths, as through combining logic and memory on the same IC, enhances performance.

The applications for blending memory and logic on the same IC are varied, and increasing. See "Silicon Processing for the VLSI Era", Volume 2, Process Integration, S. Wolf, pp. 571–572. Some applications add special logic circuits to memory designs, while others add memory structures to primarily logic IC's. An example of the latter is the Intel 80486 microprocessor, which in addition to the main processor logic has an embedded SRAM (Static Random Access Memory) used as a first-level cache.

However, it is not believed that a comprehensive approach and detailed manufacturing methodology for achieving a blending of logic and memory has heretofore been disclosed. One example of blending technologies is the formation of both bipolar and CMOS device structures on the same chip, for example as disclosed in U.S. Pat. No. 5,066,602 (Takemoto) and U.S. Pat. No. 5,340,762 (Vora), but the process technology to simultaneously form MOS logic and memories is not discussed.

SUMMARY OF THE INVENTION

It is therefore an object of the invention to provide a method for forming logic and memory devices on the same integrated circuit.

It is a further object of the invention to provide an integrated process for forming any two or more of the following device types on the same semiconductor substrate: logic, non-volatile ROM, poly-load SRAM, stacked capacitor DRAM, and TFT SRAM.

It is a further object of the invention to provide a method of simultaneously manufacturing logic and memory devices on the same integrated circuit with a minimum number of processing steps, so as to reduce manufacturing cost.

It is a still further object of the invention to improve the performance of logic and memory devices that interoperate by manufacturing them on the same integrated circuit.

It is yet another object of the invention to provide a method of simultaneously manufacturing logic and memory devices on the same integrated circuit in which thermal cycles used in memory processing are minimized to reduce logic shift in the logic.

It is still another object of the invention to provide a method for manufacturing logic and memory devices on the same substrate in which all the necessary voltage biases for such devices are provided while minimizing the impact on the logic performance.

These objects are achieved by a method of forming semiconductor logic devices and memory devices on a single semiconductor substrate, in a logic region and memory region, respectively. Memory devices that may be formed include non-volatile memory, DRAM and/or SRAM (poly-load or TFT). A semiconductor substrate having a first conductivity type dopant is provided. A triple-well structure is formed in the semiconductor substrate, having N-well regions, P-well regions, and P-well in N-well regions. Field isolation regions are formed. A cell is formed for each memory device in the memory regions. A channel implant is performed in the substrate for each of the logic and memory devices. A primary gate and gate oxide is formed for each of the logic and memory devices. LDD active regions and heavily doped source/drain regions are formed adjacent to each gate. Additional memory structures are formed, such as a DRAM capacitor. An interlevel dielectric and contact openings therein are formed. One or more metal layers are subsequently deposited over the inter-level dielectric layer and in the openings to make contact to the contact regions.

DESCRIPTION OF THE PREFERRED EMBODIMENTS

Figure 1:
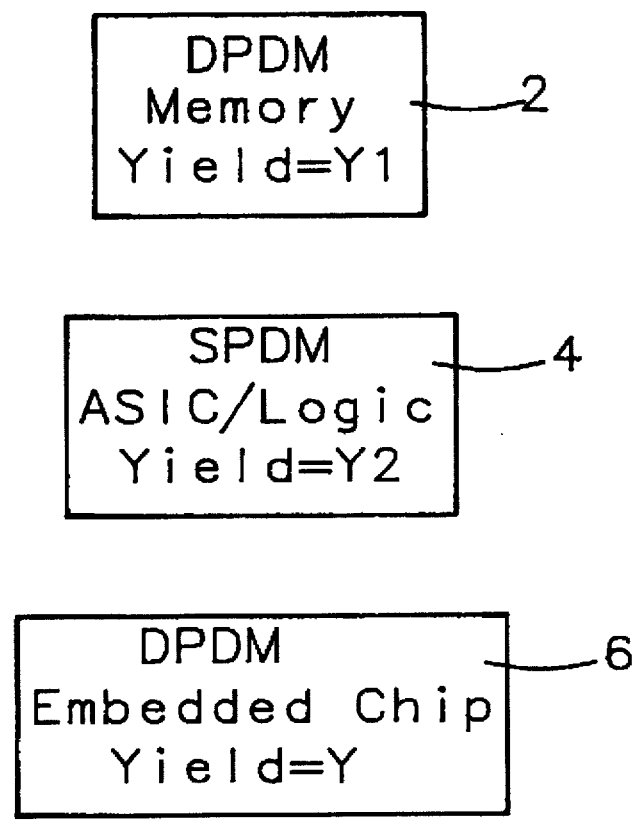
FIG. 1 is a schematic representation of separate logic and memory devices of the prior art, and a blended IC of the invention.

For the reasons stated above, it is increasingly desirable to combine memory devices with logic devices, or with other memory structures, on the same IC. The method of the invention provides for the primary memory types that are used in integrated electronics currently, including non-volatile memory, DRAM (Dynamic Random Access Memory) and SRAM. More specifically, the invention provides for the formation of various types of non-volatile memory, e.g., EEPROMs (Electrically Eraseable Programmable Read Only Memories), EPROM (Eraseable Programmable Read Only Memories), Flash memories, and mask ROMs, as well as stacked capacitor DRAMs, and the two most common SRAM types, poly-load and TFT (Thin Film Transistor).

The processing steps described below to form these memory devices have been optimized to integrate the manufacture of the devices with each other and with logic devices, on the same substrate.

The method of the invention is applicable to sub-micron feature sizes including, but not limited to, 0.5 um. (micrometer) or 0.35 um. dimensions.

Referring now to FIGS. 2, 3A, 3F, 4, 5A/B and 6A/B, the integrated process of the invention for blending logic and memory devices on the same integrated circuit is described. Certain processing steps are common to all types of devices formed by the method of the invention—logic, nonvolatile ROM (NVROM), poly-load SRAM, stacked capacitor DRAM, and TFT SRAM. The common steps are those shown as individual elements in FIG. 2. Other processing for memory devices is required at the stages labelled A–E in FIG. 2 and vary depending on the type of memory desired.

The process of the invention provides sufficient flexibility so that any combination of devices may be formed. The most likely combinations are logic with one of the several memory types noted above. However, one could also combine logic with two or more of the memory device types, as well as combining any two or more of the memory types without logic devices. Any embodiments described below are given to exemplify but not limit the combination of devices that may be formed according to the process of the invention.

The first steps common to all devices formed by the method of the invention are well formation 20, active region formation 22 and field isolation 24. When these devices are formed separately in the prior art, twin-well technology, as is known in the art, is typically used for CMOS devices. In a twin-well process, the PMOS transistors are formed in an N-well, and the NMOS transistor and/or memory cell are formed in a P-well. The substrate may be doped either N- or P-depending on the circuit needs of the particular device being formed.

However, a substrate back-bias is needed for some EEPROM devices, to alleviate field device leakage, and is necessary for DRAMs to reduce minority carrier injection effects. If twin-wells and a back-bias were used for the blended IC of the invention, the logic performance would suffer due to an increase in threshold voltage and subsequent degradation of current drive. Therefore, a triple-well structure is used, as described below with reference to FIGS. 2A–2D.

Initially, a single-crystalline substrate 10 is doped P-by implanting boron at a concentration of between about 1 E 12 and 1 E 14 atoms/cm.$^2$ and an energy of between about 100 and 500 KeV. Alternately mega-eV implantation may be used at an energy of between about 500 and 2000 KeV.

Creation of the three well structures is now described, with an N-well formed in regions 12 of the substrate, a P-well in regions 14, and a P-well inside an N-well in regions 16. Initially regions 14 are masked during an N-well ion implant, in which phosphorus 17 is implanted at an energy of between about 120 and 200 KeV. and at a dosage of between about 5 E 12 and 5 E 13 atoms/cm.$^2$. A drive-in of the implanted phosphorus 18 is performed in N$_2$ (nitrogen) or diluted O$_2$ (oxygen) ambient, for between about 5 and 20 hours, and at a temperature of between about 1000° and 1200° C., resulting in N-wells 19, as shown in FIG. 2B.

A thin pad oxide (not shown) of 100 to 300 Angstroms is formed on the substrate surface, grown thermally at a temperature of between about 800° and 1000° C. This is followed by deposition of a layer of Si$_3$N$_4$ (silicon nitride, also not shown) by LPCVD (low pressure chemical vapor deposition) at a thickness of between about 1000 and 2000 Angstroms.

Active region formation 22 and field isolation 24 are now performed. The oxide/nitride is patterned to protect the areas of the substrate in which active devices are to be formed and to expose the regions where field isolation is desired, between the active region areas. When the method of the invention is used at feature sizes of 0.5 um., a LOCOS (LOCal Oxidation of Silicon) process is used to grow a field oxide in the field isolation regions. The substrate is heated in steam or dry O$_2$ for between about 30 and 250 minutes and at a temperature of between about 900° and 1200° C. The field oxide 24, as shown in FIG. 2C, has a resultant thickness of between about 3000 and 6000 Angstroms.

For smaller feature sizes, for example at 0.35 um. or below, LOCOS may be used, or alternately more advanced isolation processes may be implemented, such as shallow trench isolation. In the latter process, after patterning the oxide/nitride mask, the substrate is etched by reactive ion etching (RIE) to form trenches in the field isolation regions, a thick oxide is deposited in the trenches and over the substrate, and the thick oxide is then etched back to leave the oxide only in the field isolation trenches.

The nitride and pad oxide are stripped, and a sacrificial oxide is grown on the substrate surface, as is well known in the art. A mask for the P-well implant is formed so that N-well regions 12 are masked from implant of boron 23, which is performed at an energy of between about 100 and 150 KeV. and a dosage of between about 5 E 12 and 5 E 13 atoms/cm.$^2$. The P-well 25 in regions 14 and the P-well 25 in N-well 19 in regions 16, as depicted in FIG. 2D, is formed by driving in the implanted boron at a temperature of between about 900° and 1200° C.

Up to this point in the method of the invention, all processing in the logic and memory regions is identical, for well, active region and field isolation formation. Subsequently, as indicated by step "A" in FIGS. 2 3A, 3F, 4, 5A/B and 6A/B, one to several process steps must be performed in the memory regions, while none of these steps are performed in the logic regions, i.e., the logic portions of the substrate are protected from processing done in the memory regions.

Referring to FIGS. 3A–3K, formation of an EEPROM requires several processing steps at this stage, to form a tunnel oxide, and to form a gate oxide for the high-voltage transistor. An EEPROM allows for the electrical programming (as opposed to ultraviolet light or other programming means of earlier EPROM devices) and erasure of each memory cell by means of a thin tunnelling oxide, and a high-voltage transistor is also required for programming and erasing operations. The method of the invention provides for forming either single-poly (FIGS. 3A–3E) or double-poly (FIGS. 3F–3K) EEPROMs.

Figure 3A:
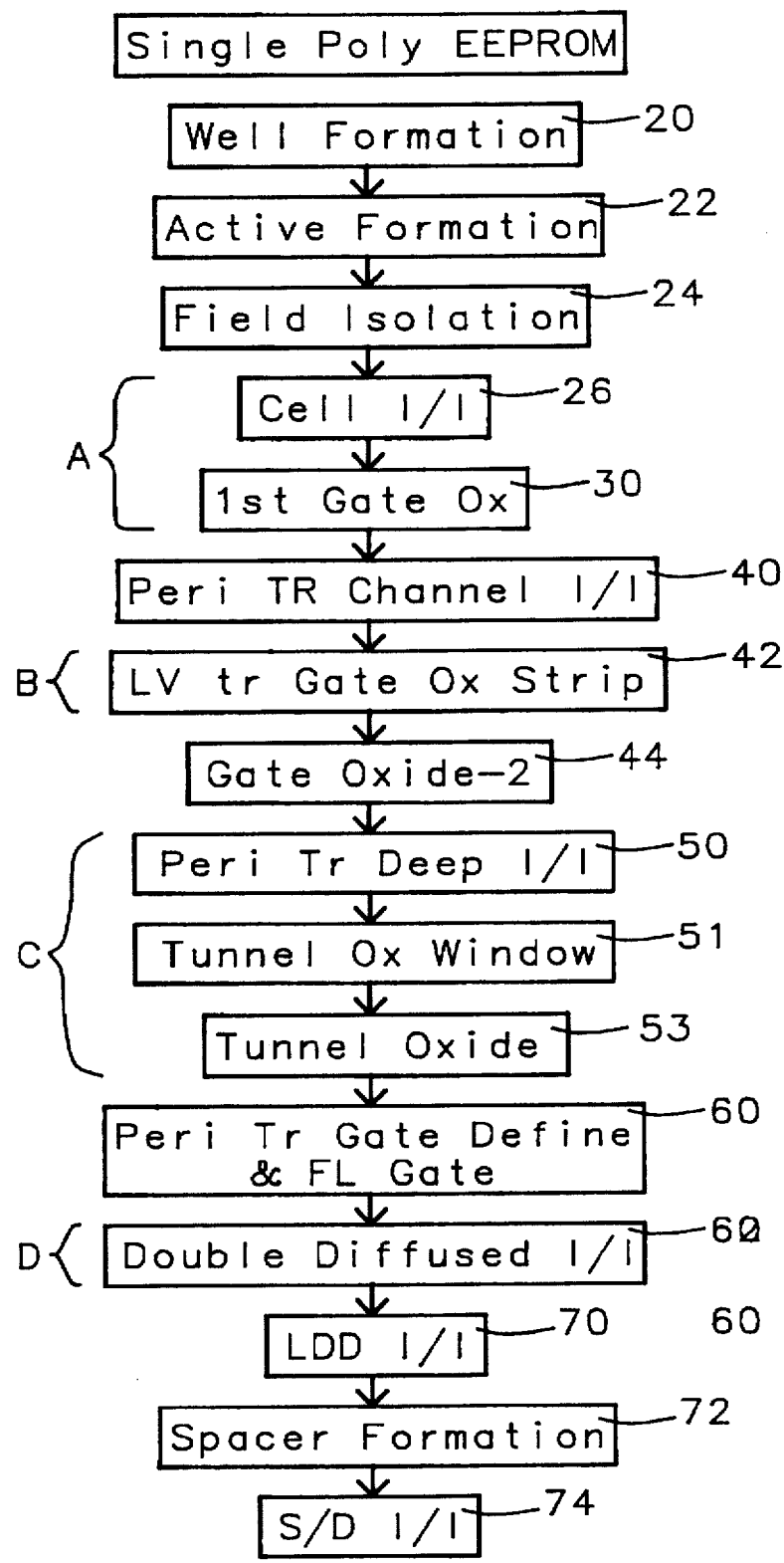
FIG. 3A is a representation in flowchart form of an optimized process of the invention for forming a single-poly EEPROM simultaneously with the formation of logic devices on the same substrate.
Figure 3B:
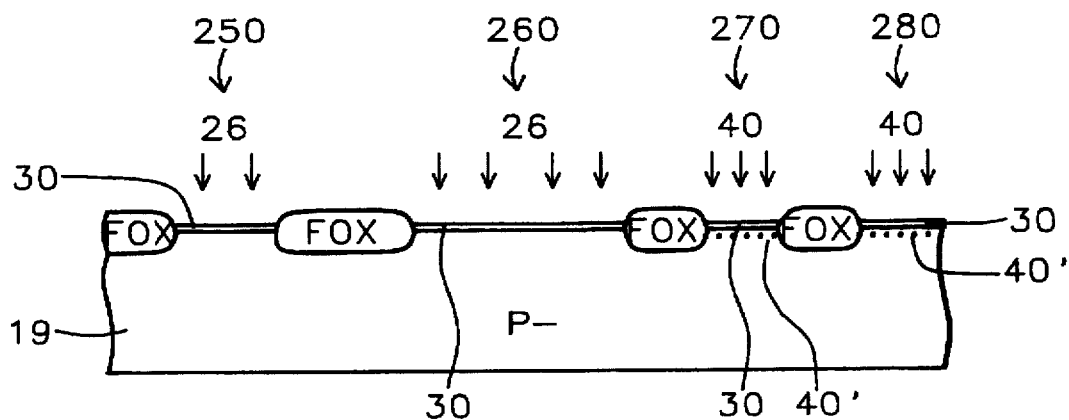
FIGS. 3B-3E are a cross-sectional representation of the method of the invention for forming a single-poly EEPROM in accordance with the process of FIG. 3A.
Figure 3C:
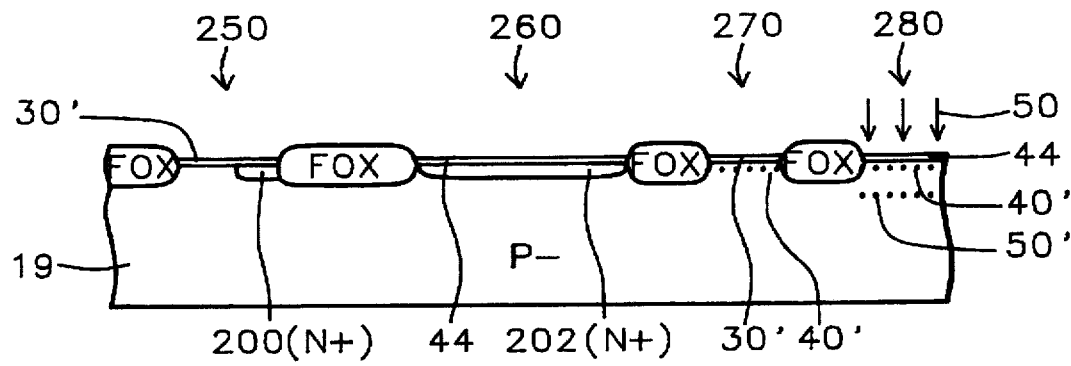
Figure 3D:
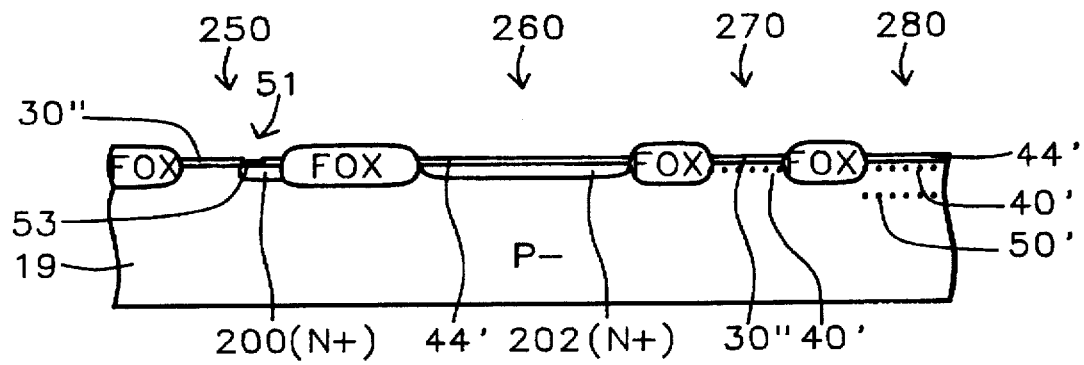
Figure 3E:
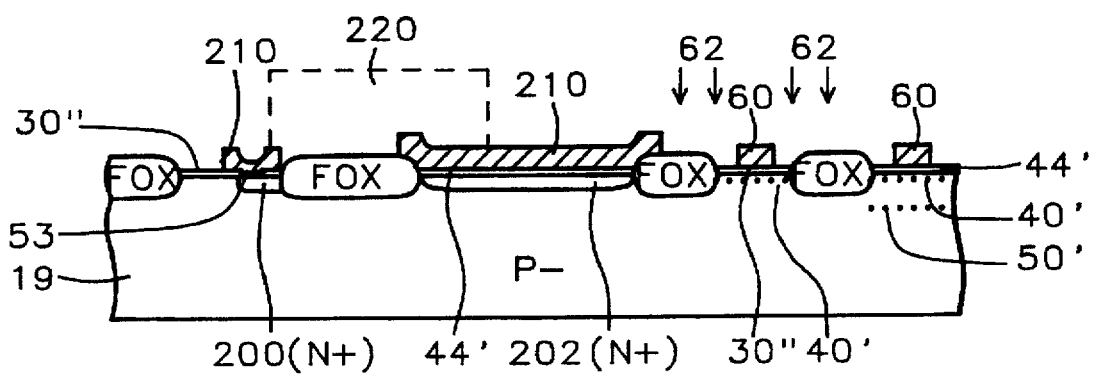
Figure 3G:
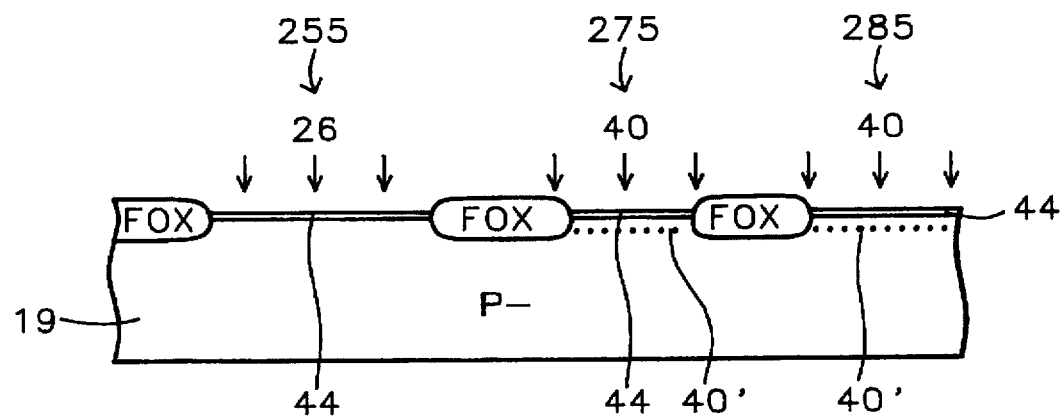
FIGS. 3G-3K are a cross-sectional representation of the method of the invention for forming a double-poly EEPROM in accordance with the process of FIG. 3F.
Figure 3H:
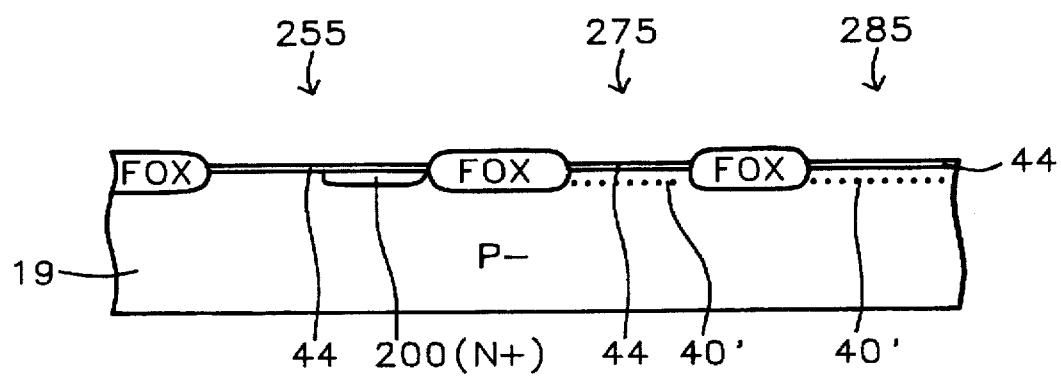
Figure 3F:
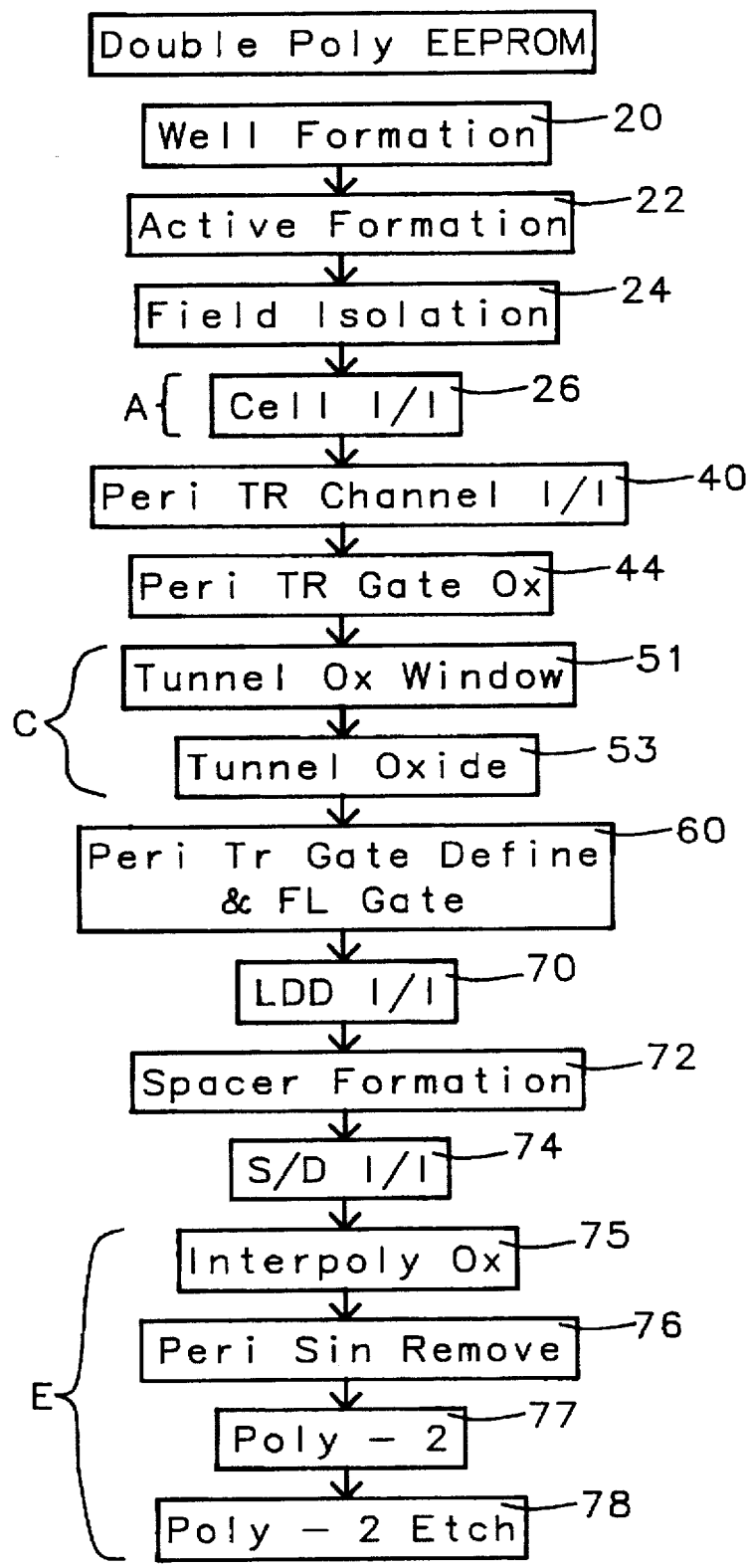
FIG. 3F is a representation in flowchart form of an optimized process of the invention for forming a double-poly EEPROM simultaneously with the formation of logic devices on the same substrate.

The first "A" step of FIGS. 3A and 3F is a cell tunnel ion implant 26, in which phosphorus P$^{31}$ is ion-implanted at a dosage of between about 1 E 13 and 5 E 14 atoms/cm.$^2$ and at an energy of between about 80 and 200 KeV. This implant serves the purpose of sustaining the high voltage that must be used during programming and erasure of the EEPROM cell, where the high voltage (on the order of 15–20 volts) is needed to induce Fowler-Nordheim tunnelling of electrons across the thin tunnel oxide (yet to be formed). This implant is only performed in the cell regions 250/260 of the single-poly EEPROM and 255 of the double-poly device.

In the double-poly EEPROM cell, the cell tunnel ion implant is used to form region 200, which extends under tunnel oxide 53 (yet to be formed). In the single-poly cell, the cell tunnel ion implant is used to form regions 200 (also extending under the tunnel oxide) and 202, the latter of which forms the control gate for the single-poly cell. The implanted ions are activated during subsequent oxidation steps.

Referring now to the single-poly EEPROM of FIG. 3B, a first gate oxide 30 having a thickness of between about 100 and 150 Angstroms, and preferably of 125 Angstroms, is formed by thermal oxidation of the substrate surface at between about 800° and 1100° C. for between about 30 and 90 minutes.

Figure 4:
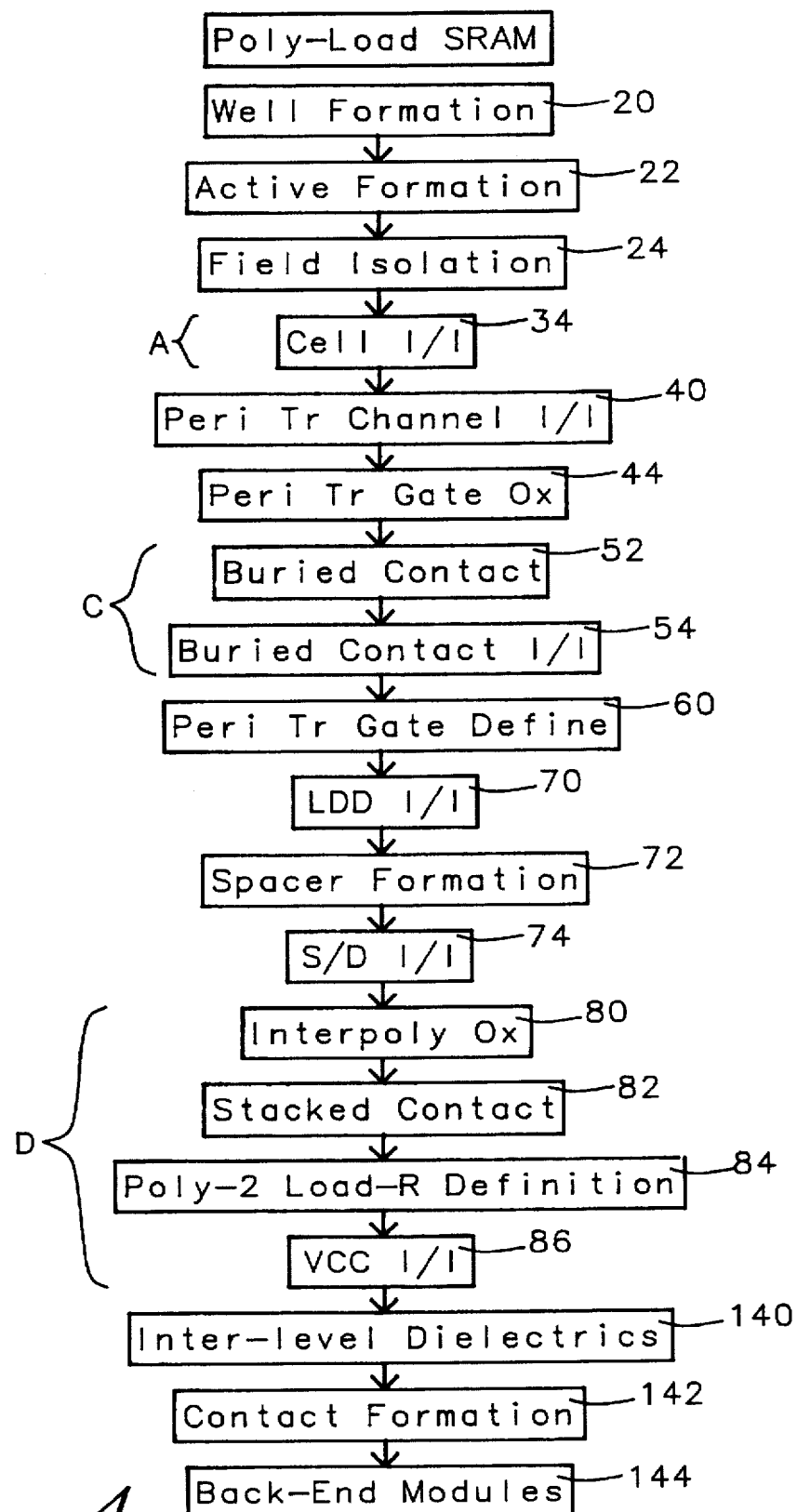
FIG. 4 is a representation in flowchart form of an optimized process of the invention for forming a polysilicon-resistor-load SRAM simultaneously with the formation of logic devices on the same substrate.
Figure 4A:
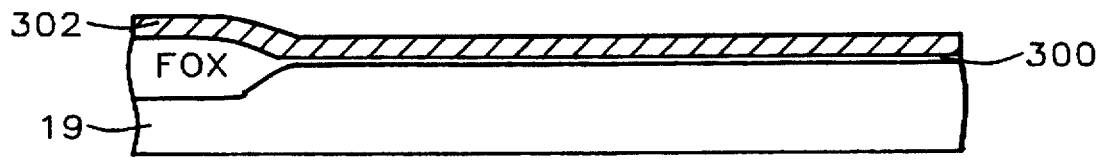
FIGS. 4A-4E are cross-sectional representations of a method of the invention for forming a buried contact for an SRAM.
Figure 4B:
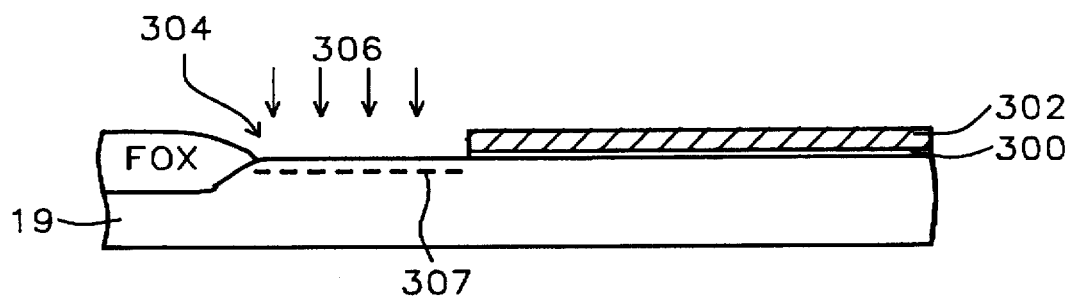

Referring now to FIGS. 4–6, step "A" is a single cell ion implant 34, for either type of SRAM and for the stacked capacitor DRAM of the invention, in which the memory cell region is implanted with B (boron) or BF2$^+$ (boron fluoride) at a dosage of between about 5 E 11 and 5 E 13 atoms/cm.$^2$ and at an energy of between about 10 and 80 KeV. This serves the purpose of raising the cell transistor threshold voltage ($V_T$), to prevent sub-threshold leakage and subsequent data loss. While a typical NMOS peripheral transistor has a $V_T$ of 0.5 to 0.8 volts, the memory cell NMOS transistor threshold voltage is raised to between about 1 and 1.5 volts by the cell ion implant.

Processing now continues, with the next step utilized in all device regions, including logic and memory. A blanket channel ion-implant 40, using BF$_2$ at an energy of between about 30 and 60 KeV. and a dosage of between about 1 E 12 and 1 E 13 atoms/cm.$^2$, is used to adjust the transistor threshold voltage for the logic devices, including those in the peripheral area of the memory structures. Boron ions 40', as shown by example in FIGS. 3C and 3H, are implanted in the substrate as a result of this process.

Figure 2:
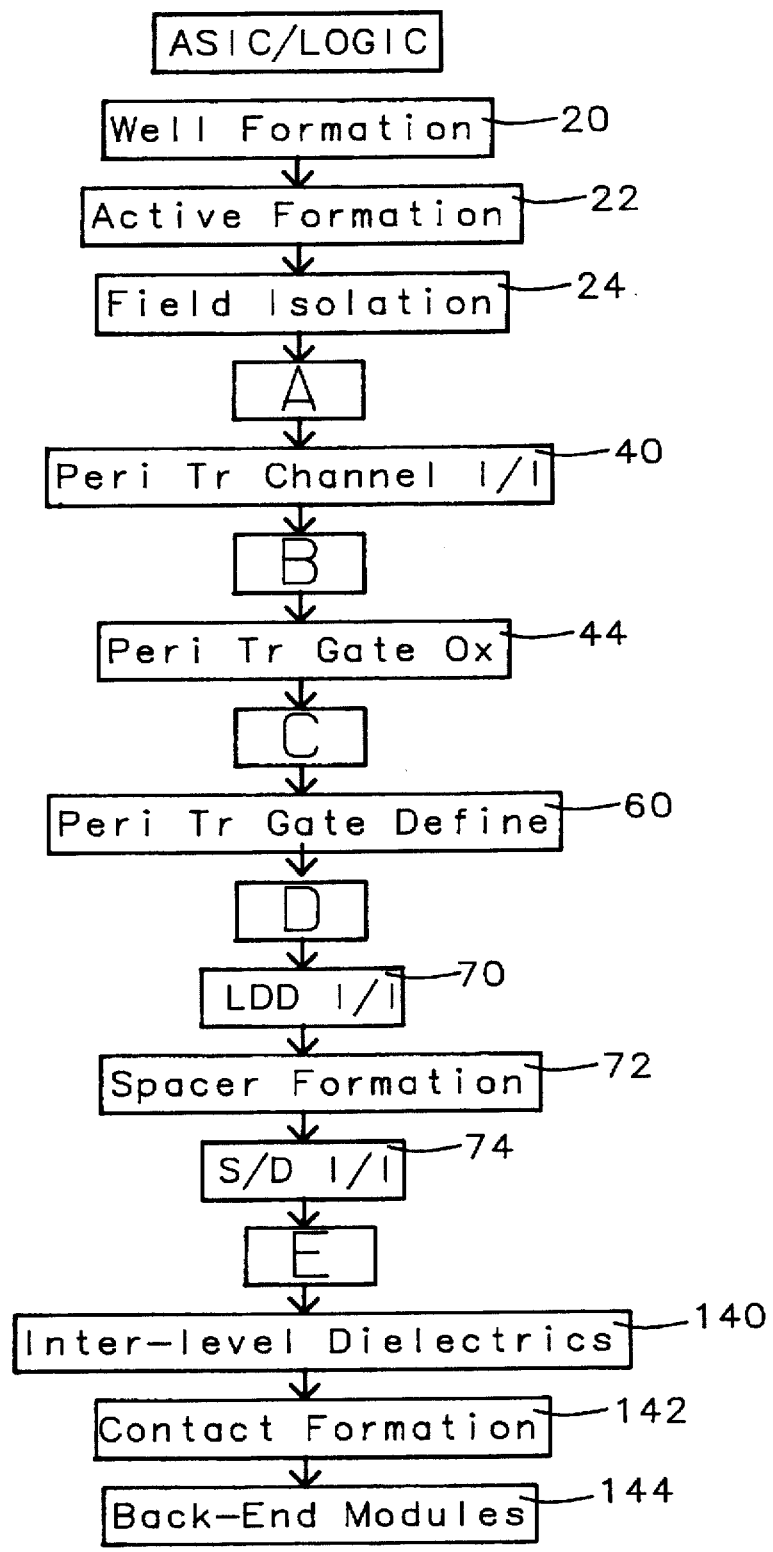
FIG. 2 is a representation in flowchart form of the integrated process of the invention for forming logic and memory devices on the same integrated circuit.
Figure 2A:
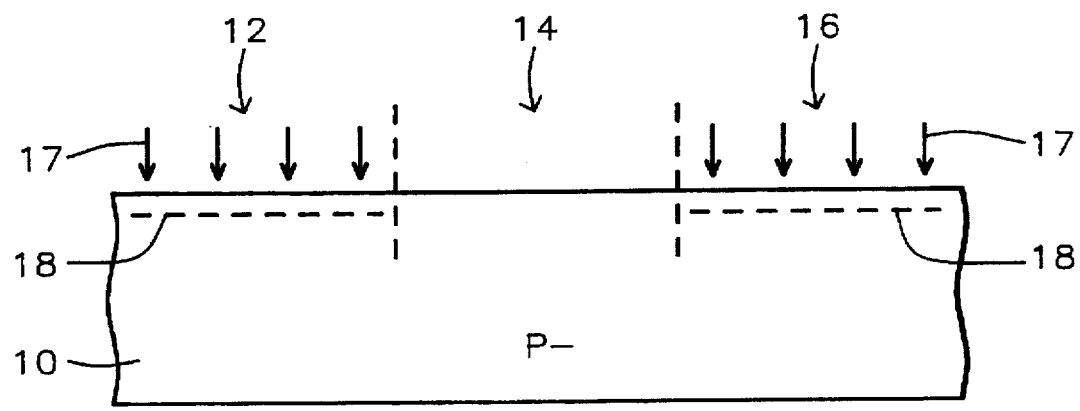
FIGS. 2A-2D are a cross-sectional representation of the method of the invention for forming a triple well structure.
Figure 2B:
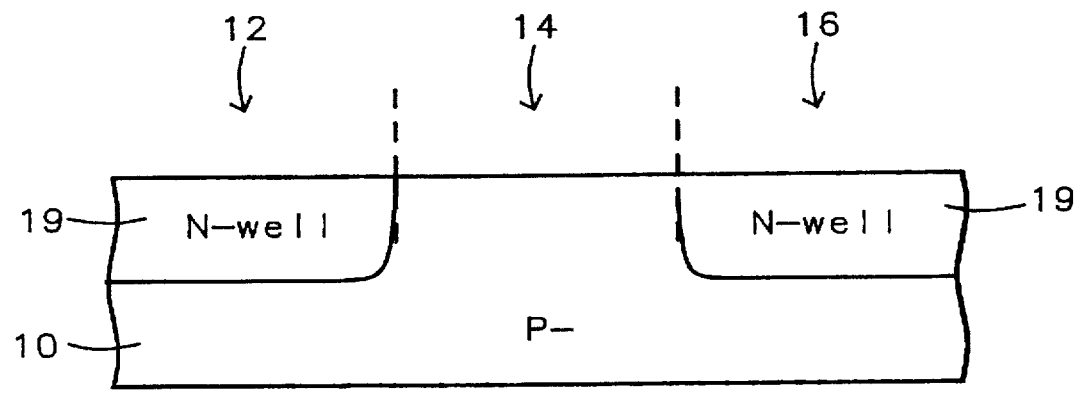
Figure 2C:
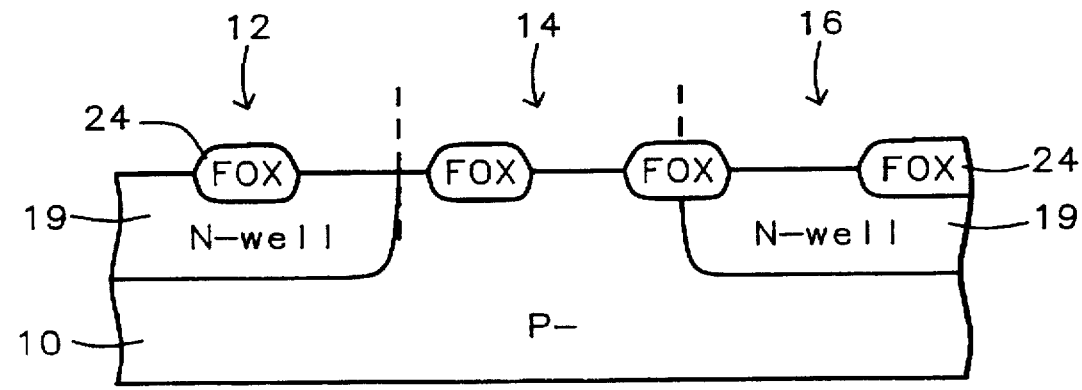
Figure 2D:
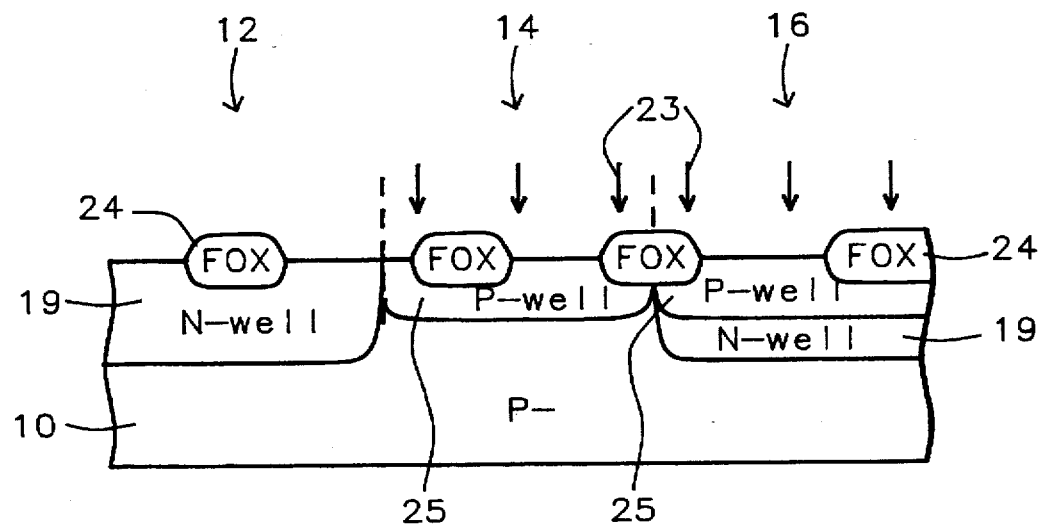

Step "B" of FIG. 2 refers to a single step 42 required for the Single-poly EEPROM of the invention, in which the gate oxide previously formed (see FIG. 3B, ref. 30) is removed in the area of the control gate 260 and the low voltage transistor 280, by etching in a dilute HF (hydrofluoric acid) solution.

In all logic and memory device types gate oxide formation 44 is now performed, as previously described, to grow an oxide having a thickness of between about 60 and 150 Angstroms, to be used for the logic FETs and for peripheral transistors in the memory structures. This gate oxide is also used in the control gate area 260 and the low-voltage transistor 280 of the single-poly EEPROM, as shown in FIG. 3C. During this gate oxidation, additional oxide is grown on first oxide 30 in the single-poly EEPROM of FIG. 3C, resulting in an oxide 30' having a preferable thickness of about 155 Angstroms, or in a range of between about 125 and 185 Angstroms. See also FIG. 3G in which the gate oxide 44 is used for all three regions 255, 275, 285 of the double-poly EEPROM.

Step "C" of FIG. 2 refers to processing steps for EEPROM, and SRAM memory devices. A deep ion implant 50 (see FIG. 3C) is performed on the low voltage transistor 280 for the single-poly EEPROM cell, to prevent transistor punch through due to the high voltage operation of the EEPROM. This implant is performed using Boron at an energy of between about 50 and 150 KeV. and a dosage of between about 1 E 11 and 5 E 12 atoms/cm.$^2$. Boron ions 50' are implanted in a region below previously implanted boron 40'.

Figure 3I:
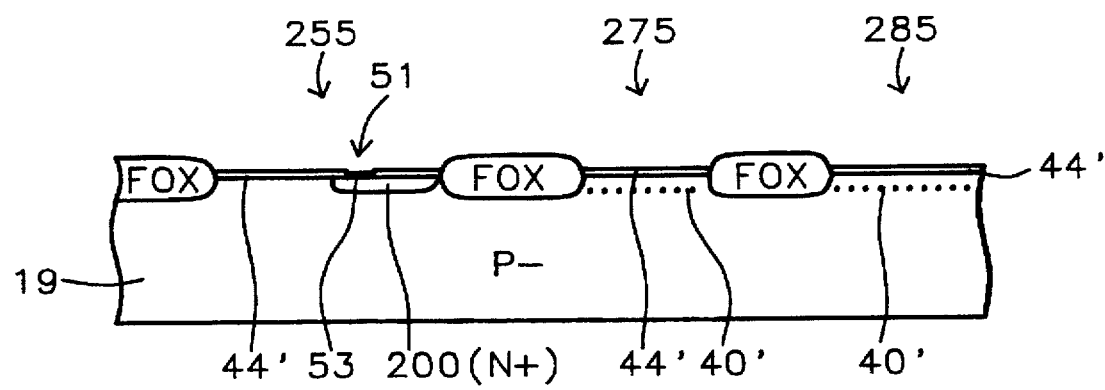
Figure 3J:
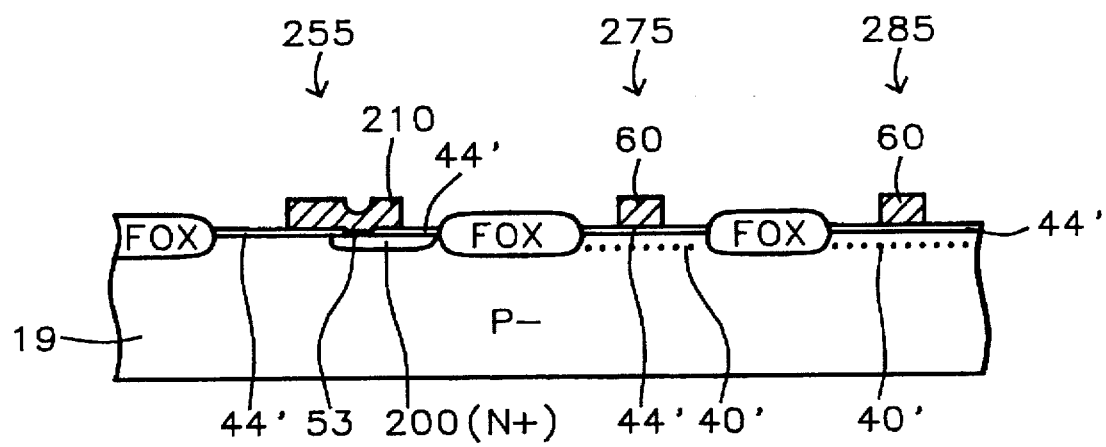

The next step is the creation of a tunnel oxide window 51 for both the single-poly and double-poly EEPROMs, as shown in FIGS. 3D and 3I, in which an opening is formed in oxide 30' and 44 in regions 250 and 255, respectively. This is accomplished by forming a mask using conventional lithography and etching, with an anisotropic etch using reactive ion etching to remove the oxide in the mask opening window 51. A high-quality, thin tunnel oxide 53 is then grown at a temperature of between about 800° and 1150° C. in a diluted O$_2$ ambient, with the resultant oxide having a thickness of between about 65 and 120 Angstroms. After this oxidation, oxide 30" has a thickness of about 180 Angstroms, and oxide 44' is about 120 Angstroms thick.

The equivalent "C" steps for the SRAM devices of the invention are described as follows.

Figure 4C:
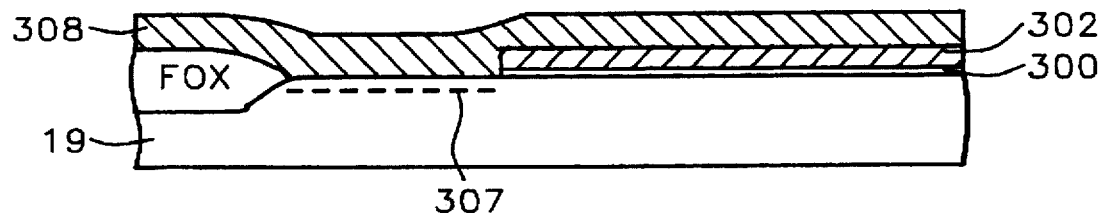
Figure 4D:
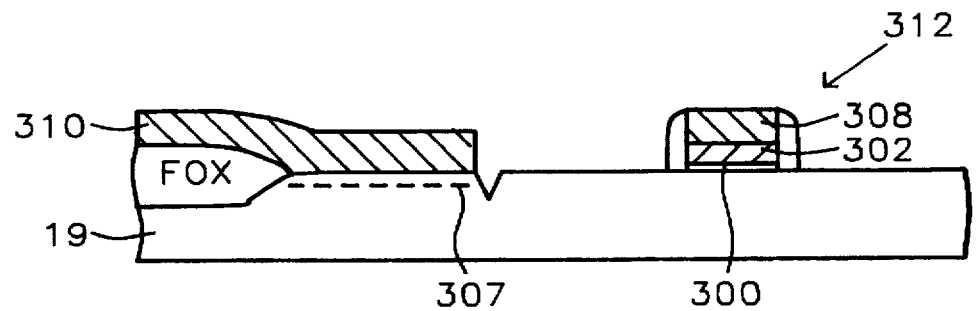
Figure 4E:
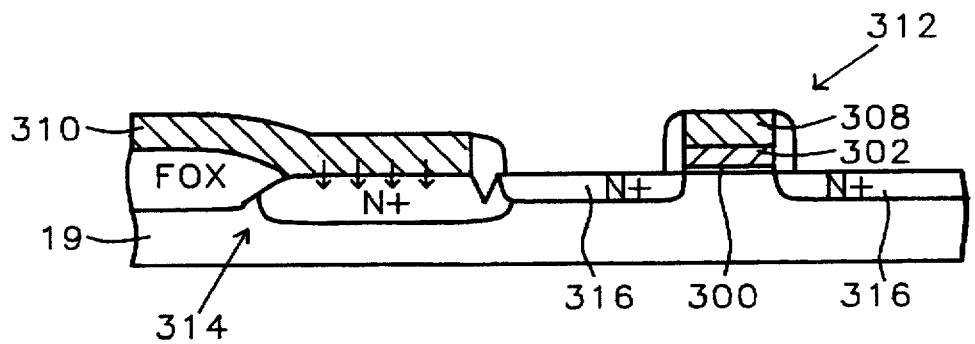
Figure 4F:
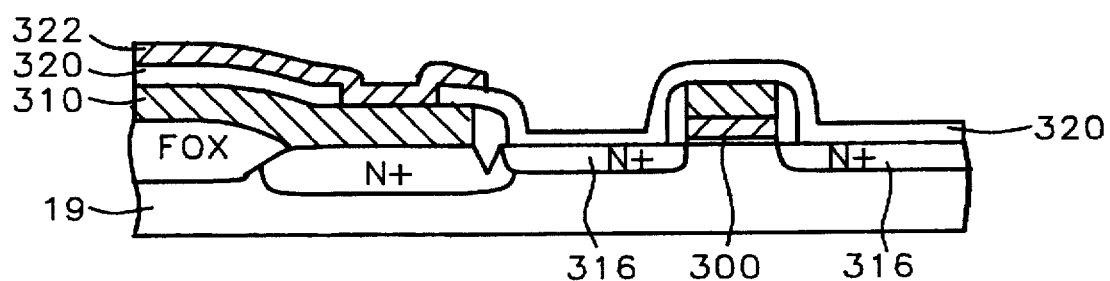
FIG. 4F is a cross-sectional representation of an SRAM stacked contact formed in accordance with the invention.
Figure 4G:
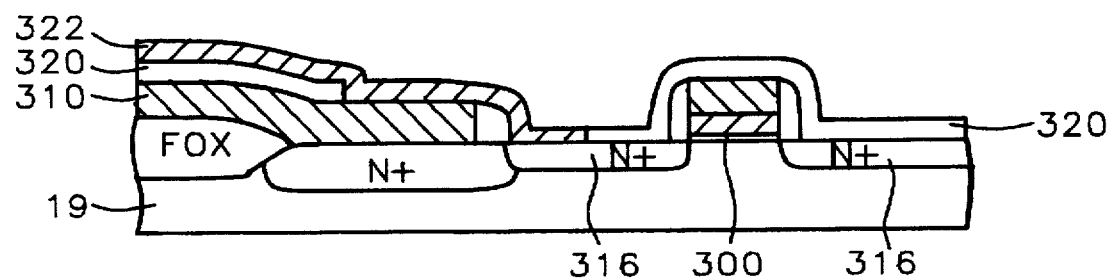
FIG. 4G is a cross-sectional representation of an SRAM butted contact formed in accordance with the invention.
Figure 4H:
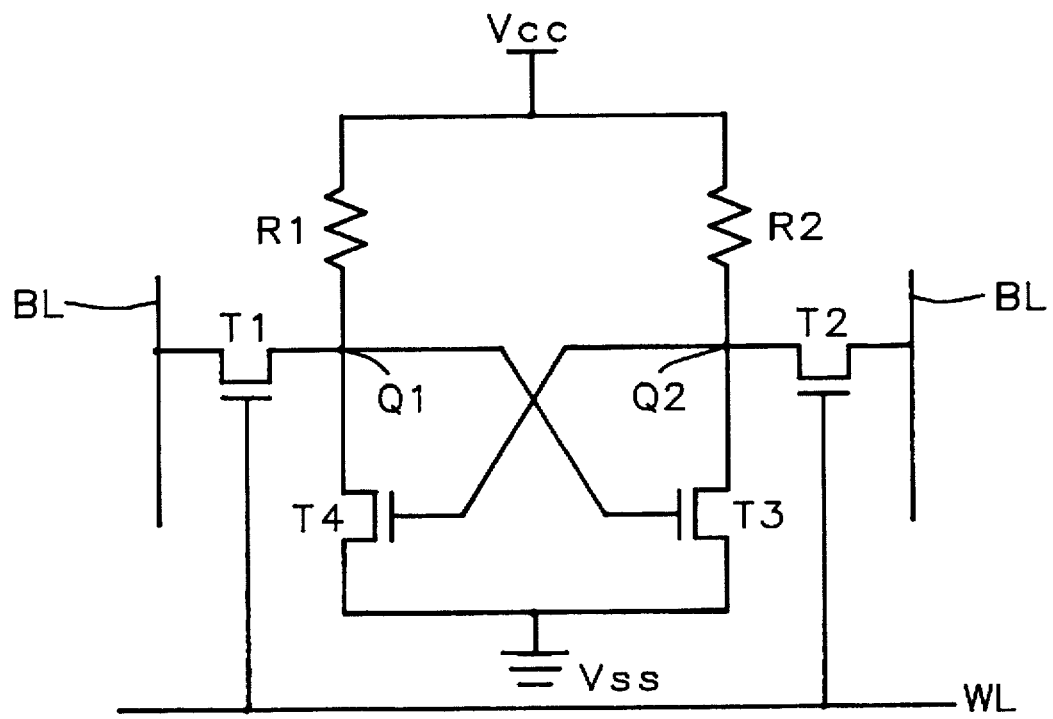
FIG. 4H is a schematic circuit diagram of a poly-load SRAM of the invention.
Figure 6A:
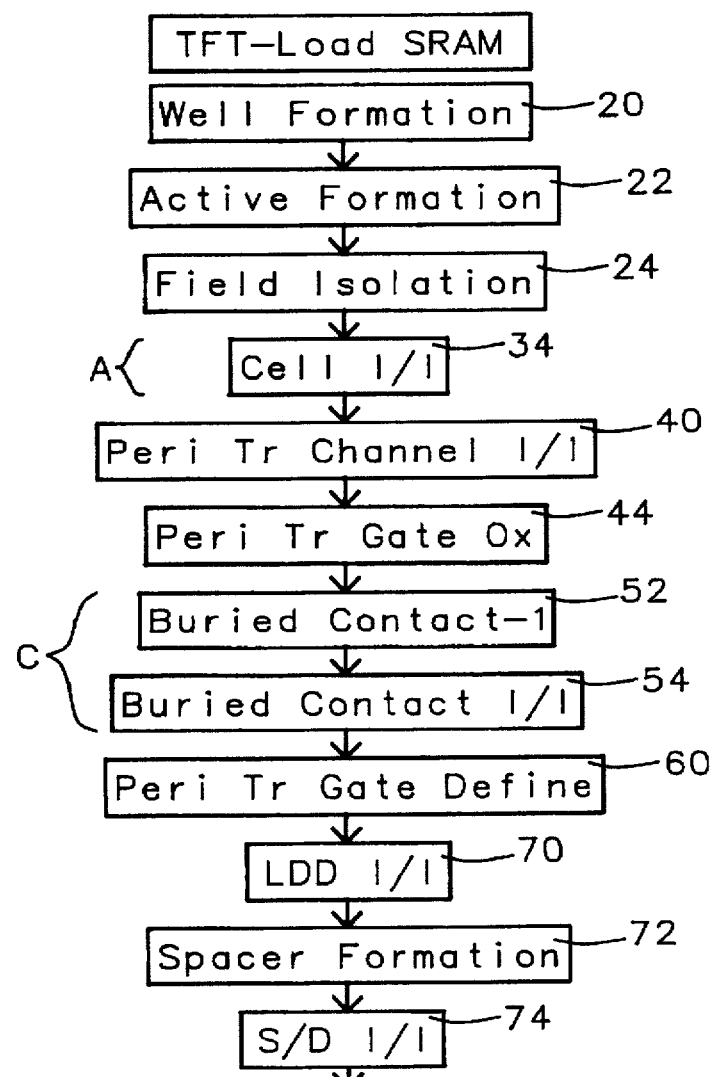
FIG. 6A-6B is a representation in flowchart form of an optimized process of the invention for forming a TFT-load SRAM simultaneously with the formation of logic devices on the same substrate.
Figure 6B:
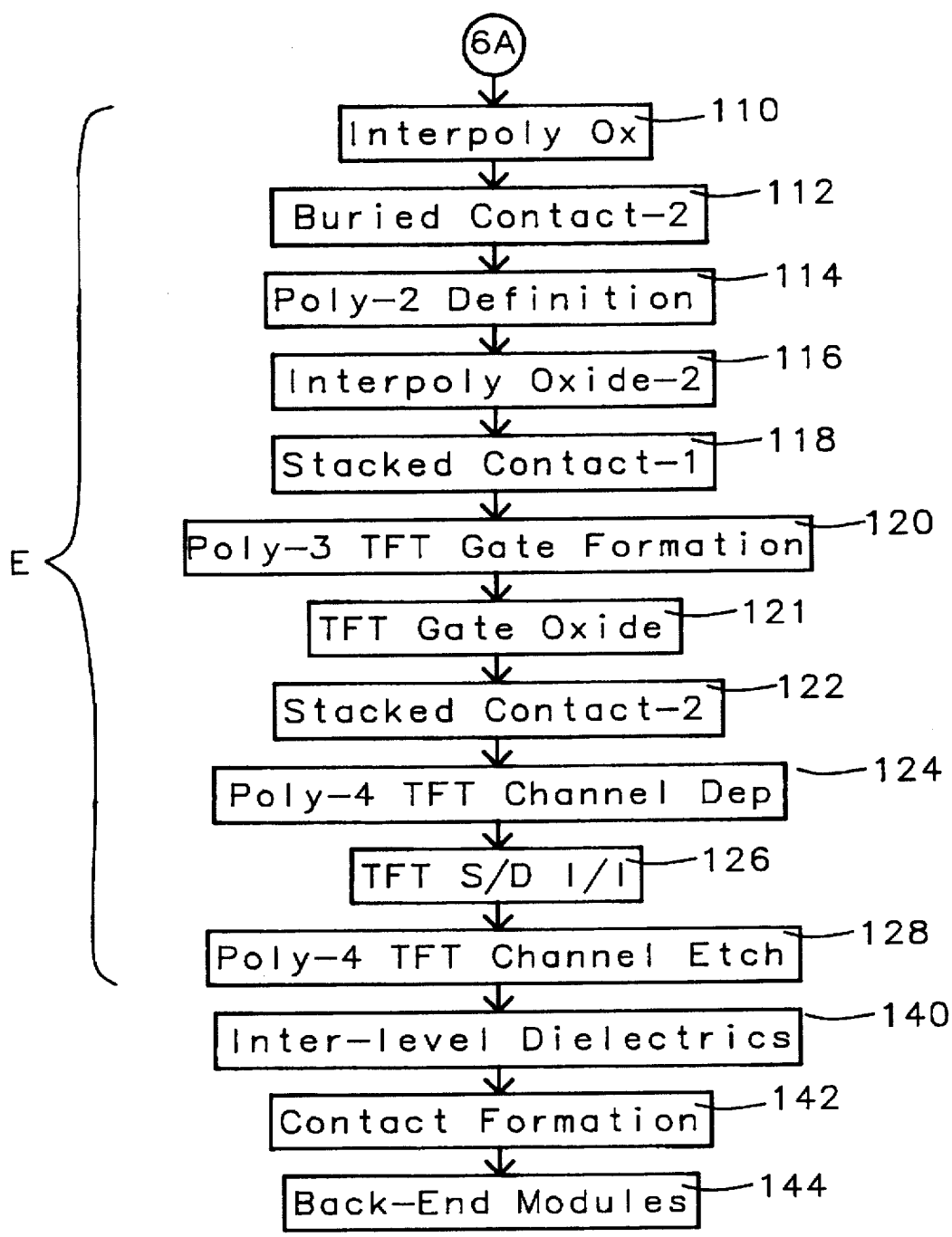
Figure 6C:
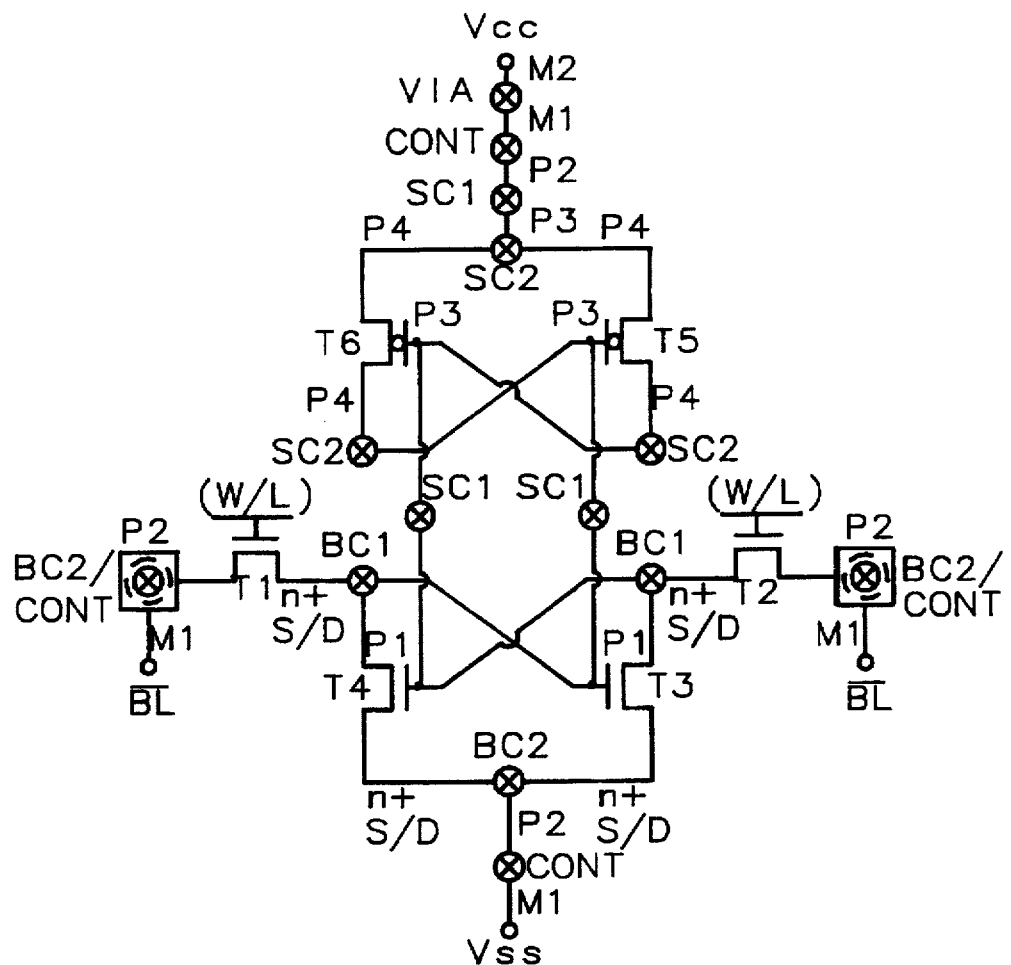
FIG. 6C is a schematic representation of a TFT SRAM formed in accordance with the invention.

The SRAM cells. of the invention have either four (for the poly-load SRAM) or six (TFT-load SRAM) transistors, with the SRAM circuits shown in FIGS. 4H and 6C. FIG. 6C depicts one cell of a TFT-load SRAM in which load devices T5 and T6 are P-channel Thin Film Transistors (TFTs), with TFTs (as opposed to FET devices) used primarily to reduce the cell size of the TFT-load SRAM. The poly-load SRAM of FIG. 4H has a similar circuit design but uses large resistance-value resistors R1 and R2 as load devices. In both SRAM types, access transistors T1 and T2 are NMOS devices whose states are controlled by wordline WL, and when conducting connect the bit lines BL and BL(not) to the main storage element, the flip-flop circuit of NMOS devices T3 and T4.

Buried contacts are used at nodes Q1 and Q2 to connect the doped polysilicon gate electrodes of devices T3 and T4 to the other structures that connect at these nodes. Returning now to the description of the manufacturing method of the invention, and particularly to FIGS. 4 and 6, and the cross-sectional views in FIGS. 4A–4E, buried contact opening formation 52 is performed. A thin layer of polysilicon 302 is deposited by LPCVD (Low Pressure CVD) at a temperature of between about 500° and 650° C., and to a thickness of between about 150 and 800 Angstroms, over gate oxide 300.

An opening 304 for the buried contact is formed through the thin poly and gate oxide, by photolithography and a wet dip. An ion implant 306 (step 54 in FIGS. 4 and 6) is then performed to create the buried contact by implanting phosphorus or arsenic at a dosage of between about 1 E 14 and 5 E 15 atoms/cm.$^2$ and at an energy of between about 20 and 100 KeV. The thin poly 302 acts as a mask for the implant, preventing introduction of the dopant ions into regions of the substrate outside of contact opening 304. A thick layer of polysilicon 308 is next deposited, and patterning of the thick poly 308, thin poly 302 and gate oxide 300 takes place using conventional lithography and etching. The resultant structure of FIG. 4D has a local interconnect 310 and gate structure 312, and buried contact region 314.

Returning now to FIG. 2, the steps of the thick poly deposition and then patterning a gate, as shown in FIGS. 4C–4D, are done simultaneously in a common step 60 in which MOS gate electrodes for both logic and memory are formed, by depositing polysilicon and defining the gates by conventional lithography and etching, over the device channel regions. It is also during this common step that floating gates 210 are formed for both the single-poly (FIG. 3E) and double-poly (FIG. 3J) EEPROMs of the invention. In the single-poly EEPROM, the two floating-gate sections are electrically connected by connection 220.

Prior to formation of the device source/drain regions, one unique step "D" is required if an EEPROM is being manufactured as part of the blended circuit of the invention. A double diffused ion implant 62, in FIG. 3E is performed in which phosphorus and arsenic are implanted each at a dosage of between about 1 E 14 and 2 E 15 atoms/cm.$^2$ and at an energy of between about 20 and 100 KeV. This provides a double diffused junction to sustain the higher than normal voltage across the high-voltage transistor 270 of the EEPROM, with this junction providing a less steep junction profile than a typical LDD region.

Lightly Doped Drain (LDD) regions are now formed in the active areas of all logic and memory devices (except the EEPROM high-voltage transistor, as explained above) using methods known in the art. A first LDD implant 70 is performed for the NMOS FET devices by implanting ions of phosphorus, arsenic, or both, at a dosage of between about 5 E 12 and 2 E 14 atoms/cm.$^2$ and at an energy of between about 20 and 80 KeV, in which the previously patterned gate structures are used as a mask. Another LDD implant is performed for the PMOS FETs, using boron-BF$_2$ (boron fluoride) or B (boron)—at a dosage of between about 5 E 12 and 5 E 14 atoms/cm.$^2$ and at an energy of between about 10 and 80 KeV. The LDD implants are then activated by an anneal in N$_2$ (nitrogen) and O$_2$ (oxygen) at a temperature of between about 800° and 950° C. for between about 25 and 35 minutes. Oxide spacers 72 are formed on the gate sidewalls, by depositing and then anisotropically etching an oxide as is known in the art, followed by a second set of heavier S/D (source/drain) implants 74 of As (NMOS), BF$_2$ (PMOS) at a dosage of between about 1 E 15 and 5 E 15 atoms/cm.$^2$ and at an energy of between about 20 and 80 KeV.

Dual gate electrodes are used in the method of the invention, providing an N+ doped gate for the NMOS devices and P+ doped gate for PMOS. The gate doping occurs during the above described S/D implants, in which the dopant ions are implanted into the respective NMOS and PMOS gates simultaneously with implantation into the S/D regions.

Section "E" of FIG. 2 provides for formation of structures for the double-poly EEPROM, and for the three RAM types of the invention, namely poly-load SRAM, stacked capacitor DRAM and the TFT-load SRAM, with the manufacturing steps differing for each memory type.

Figure 3K:
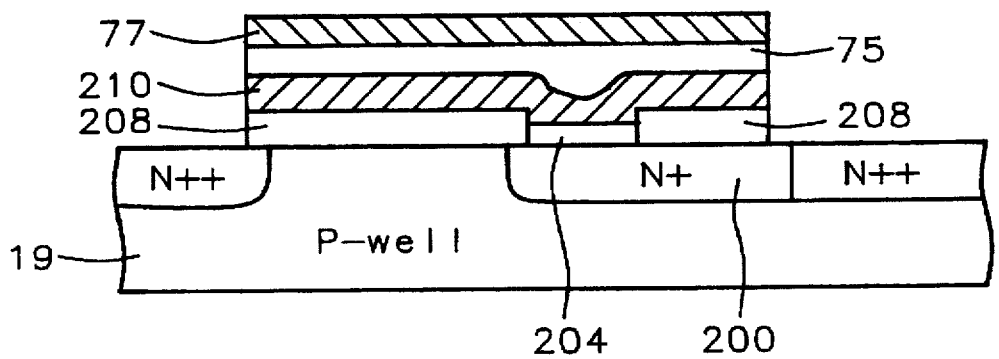

Referring first to FIG. 3K, an interpoly dielectric 75 is formed, preferably of an ONO (oxide-nitrideoxide) sandwich structure, in which a bottom oxide is thermally grown to a thickness of between about 50 and 200 Angstroms, the nitride Si$_3$N$_4$ is deposited by LPCVD to a thickness of between about 100 and 300 Angstroms, and the top oxide is deposited by LPCVD to a thickness of between about 10 and 50 Angstroms. Si$_3$N$_4$ deposited in the peripheral area is removed in step 76 by etching in, for example, hot phosphoric (H$_3$PO$_4$) acid.

A second layer of polysilicon 77 is deposited and etched 78 over the floating gate 210 and interpoly dielectric 75 to complete the control gate of the double-poly EEPROM, as shown in FIG. 3K.

Referring next to FIG. 4 for a poly-load SRAM, an interpoly oxide 80 is formed to electrically isolate the prior formed devices and first polysilicon gate electrodes from the next conductive poly patterns. This oxide is formed by, for example, PETEOS (plasma-enhanced decomposition of TEOS (tetraethyl orthosilicate)), LPTEOS (low-pressure TEOS), at between about 400° and 800° C., or HTO (high temperature oxide) at about 800° C. The oxide thickness is between about 500 and 3500 Angstroms.

Stacked contacts 82 are formed next, in which a second polysilicon layer is deposited over the prior interlevel dielectric and made to contact to the first polysilicon over the buried contact 314, as shown in FIG. 4F. This contact is made at nodes Q1 and Q2 of the FIG. 4H schematic. The FIG. 4E structure includes the buried contact 314 which after drive-in of the implanted ions 307 connects to S/D region 316. Dopant also diffuses from the thick polysilicon 310 into the substrate portion of the buried contact. The interpoly oxide 320, described above, is patterned to form an opening for the stacked contact. A second layer of polysilicon 322 is deposited and patterned, and makes contact to the first polysilicon 310 to complete the stacked contact.

In an alternative embodiment, shown in FIG. 4G, a butted contact 330 may be formed rather than the buried and stacked contact shown in FIG. 4F. In the butted contact, the second polysilicon layer 322 is made to connect to both the first polysilicon 310 and to the substrate, as shown.

The second polysilicon (poly-2) layer 322 is also used for the load resistors R$_1$ and R$_2$, and the connection to V$_{cc}$, in the poly-load SRAM of the invention. The load resistors are defined in step 84, by a light ion implant of boron, phosphorus or arsenic at a dosage of between about 1 E 12 and 1 E 13 atoms/cm.$^2$ and an energy of between about 10 and 50 KeV. A low resistivity region of poly-2 is formed for the V$_{cc}$ interconnection by a heavier implant of arsenic or phosphorus at a dosage of between about 1 E 15 and 5 E 15 atoms/cm.$^2$ and an energy of between about 10 and 50 KeV.

Figure 5A:
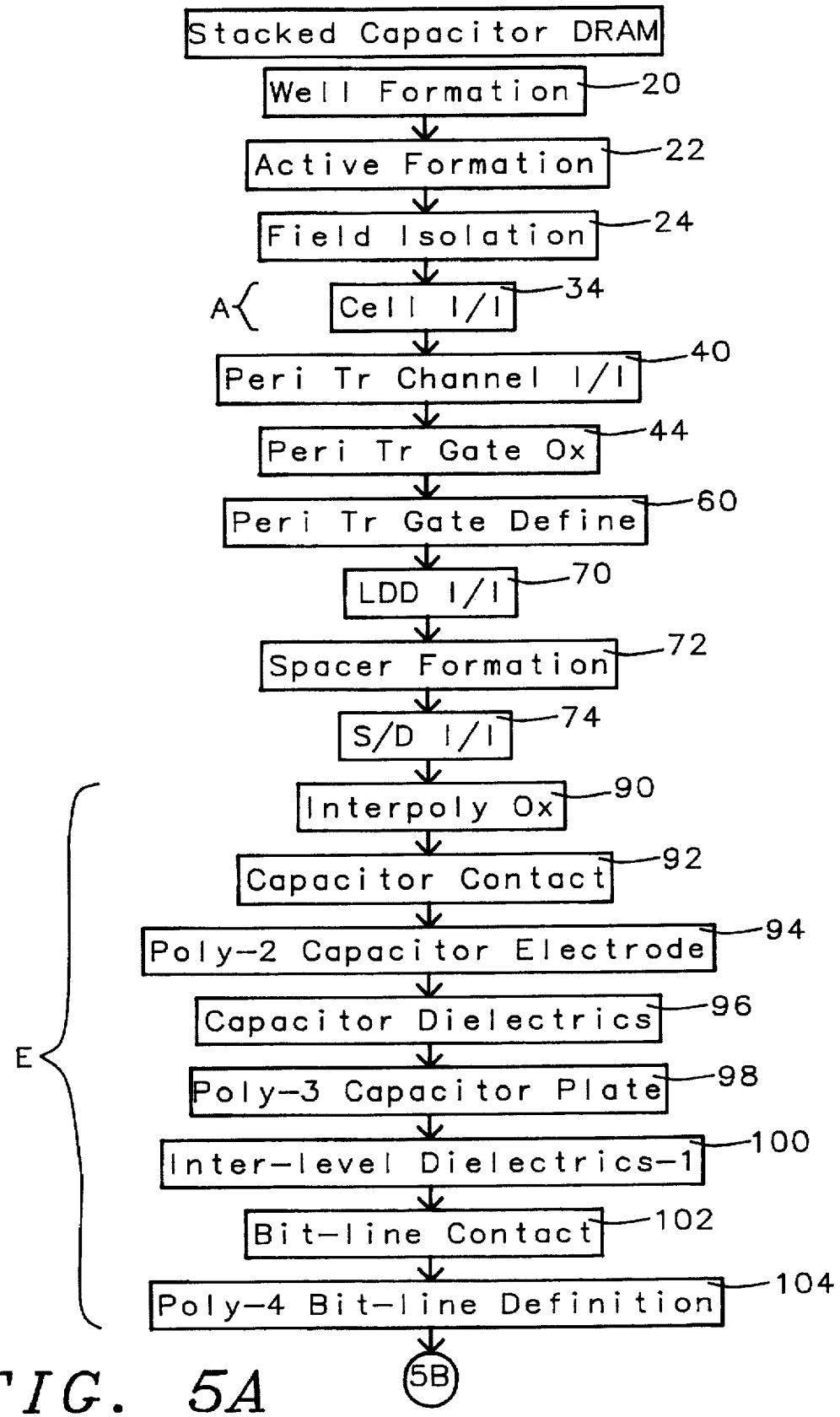
FIG. 5A-5B is a representation in flowchart form of an optimized process of the invention for forming a stacked capacitor DRAM simultaneously with the formation of logic devices on the same substrate.
Figure 5B:
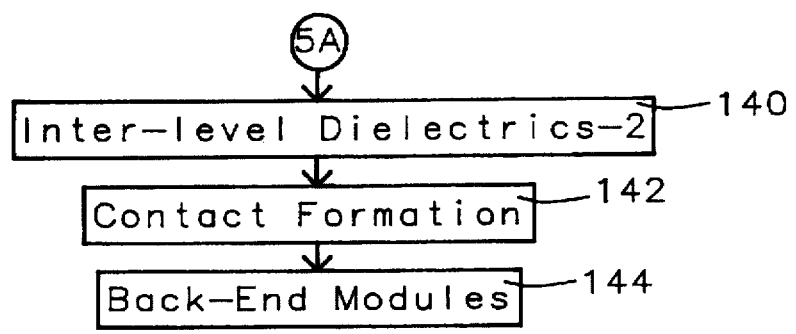
Figure 5C:
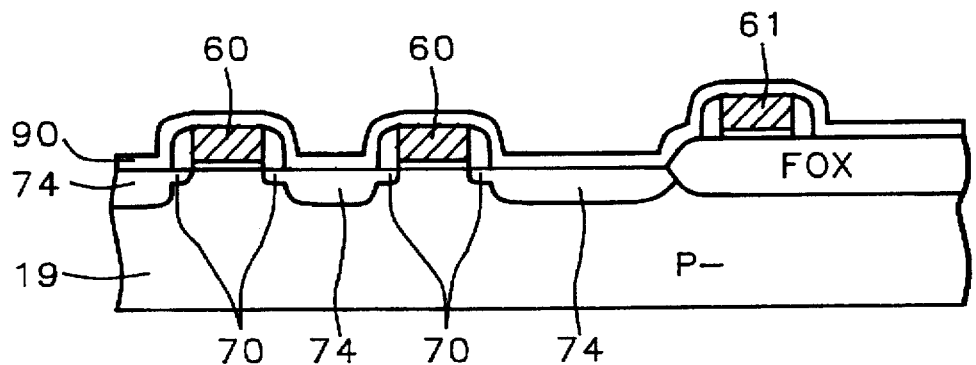
FIGS. 5C-5H are a cross-sectional representation of the method of the invention for forming a DRAM simultaneously with logic devices on the same substrate.
Figure 5D:
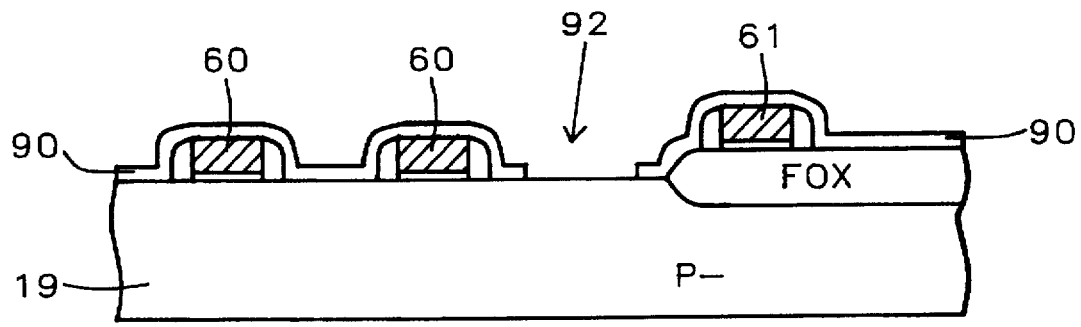
Figure 5E:
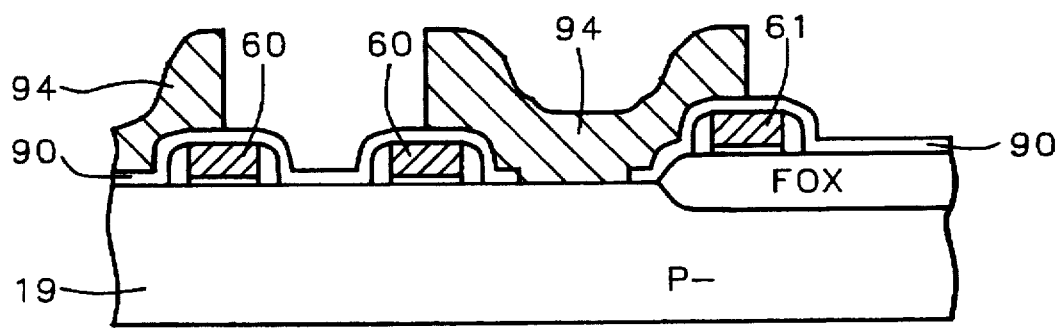
Figure 5F:
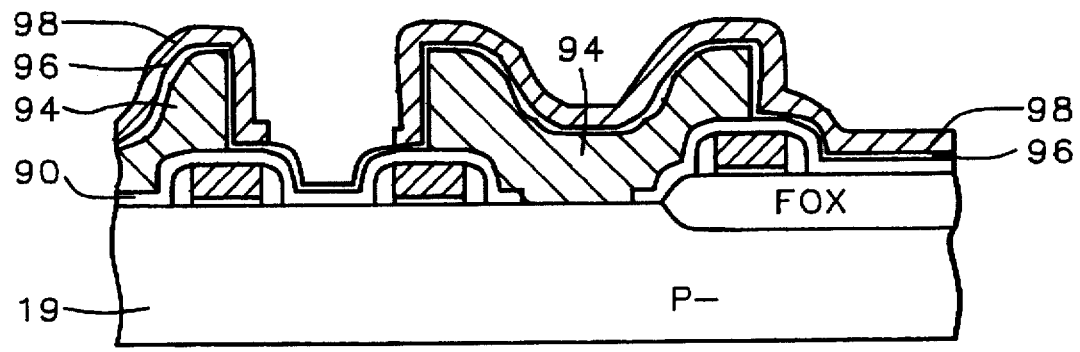
Figure 5G:
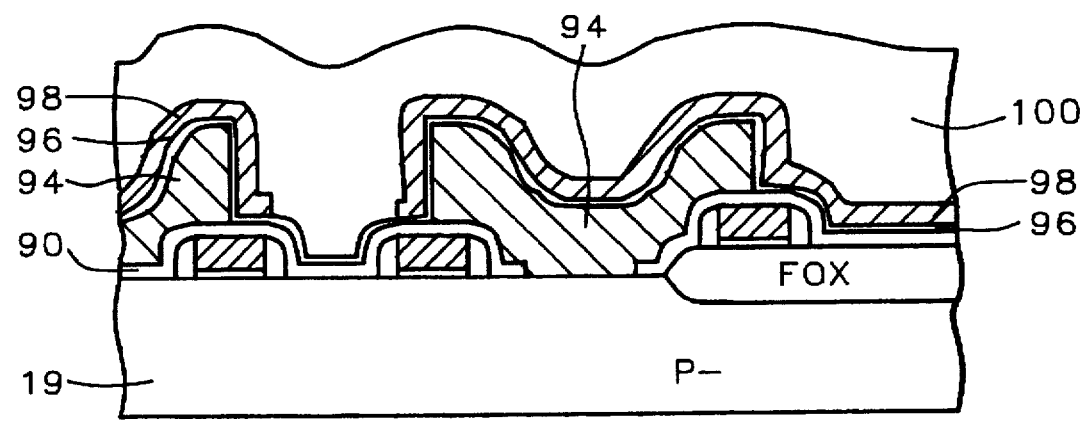
Figure 5H:
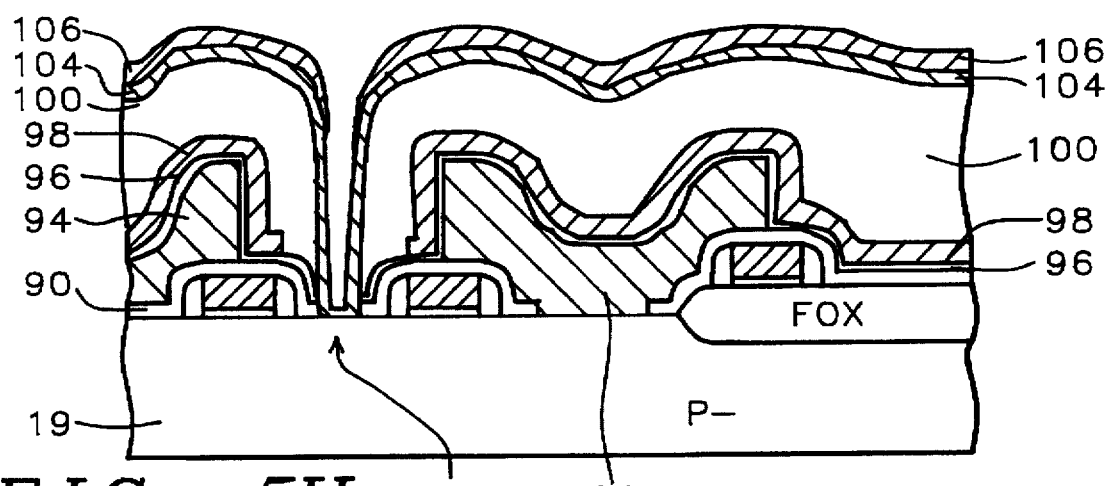

Referring now to FIGS. 5A–5B the "E" steps for DRAM formation are described. Similar reference characters as in FIGS. 5A–5B are used for elements shown in the FIGS. 5C–5H cross-sectional views of the DRAM processing. An interpoly oxide 90 is formed over the poly-1 gate 60 (and other conductive structures, such as word line 61), by decomposition of TEOS to form an oxide having a thickness of between about 500 and 3500 Angstroms. A contact opening 92 for the DRAM capacitor is formed through interpoly oxide (IPO) 90 by anisotropic etching one of the heavily doped S/D regions 74 of the FET of the memory cell. Formation of the bottom capacitor electrode 94 then takes place by deposition and patterning of a second poly layer which has a thickness of between about 1000 and 5000 Angstroms. A capacitor dielectric 96 is then formed, preferably of an ONO (oxide-nitride-oxide) sandwich structure, having an overall thickness of between about 40 and 100 Angstroms. The top plate 98 of the capacitor is formed by depositing a third polysilicon (poly-3) layer over the ONO capacitor dielectric, with the top plate having a thickness of between about 500 and 2500 Angstroms. Further interlevel dielectrics (ILD) 100 are then deposited and then re-flowed for improved planarity. A bit-line contact 102 is created by forming an opening in ILD 100 and IPO 90, as shown in FIG. 5H, followed by formation of a polycide bit-line. The bit-line is formed by depositing a fourth polysilicon (poly-4) layer 104 having a thickness of between about 500 and 1500 Angstroms, and a subsequent layer of WSi$_x$ (tungsten silicide) 106 having a thickness of between about 1000 and 3000 Angstroms.

Steps "E" for the TFT-load SRAM consists of the following, with the processing steps listed in FIGS. 6A–6B and also with reference to FIG. 6C, a schematic view of the TFT-load SRAM. An interpoly oxide 110 is formed to a thickness of between about 500 and 3000 Angstroms over the previously formed first polysilicon (P1) structures. A second buried contact 112 (BC2) is formed, in a similar manner as the first buried contact (BC1) shown in FIGS. 4A–4E. Contact BC2 connects the to-be-formed second polysilicon layer (P2) at the bit line and V$_{ss}$ contacts to the desired S/D regions, as indicated in FIG. 6C.

The second polysilicon layer (P2) is deposited and patterned, in a manner previously detailed, connecting to the buried contacts BC2 just described, and is also used in the V$_{cc}$ contact structure. A second interpoly oxide (IPO-2) 116 is deposited, followed by first stacked contact 118 (SC1). This stacked contact is formed in a manner similar to that described with respect to FIG. 4F. Contact SC1 is utilized at the V$_{cc}$ contact structure to connect poly-3 to poly-2, and also to connect the gate electrodes of the load transistors T3 and T4 to the gate electrodes of drive transistors T5 and T6, respectively, as shown in FIG. 6C. This connection is made between P1 and a third polysilicon layer (P3) described in a following section.

Figure 6D:
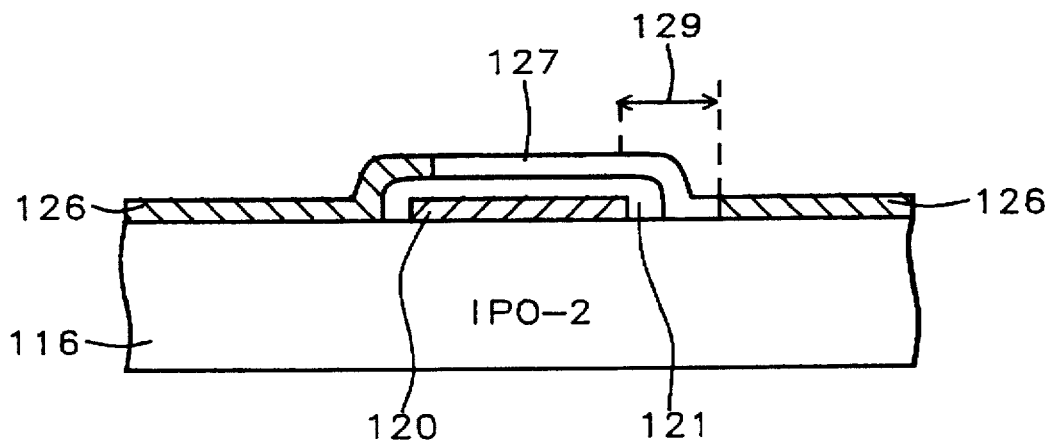
FIG. 6D is a cross-sectional representation of a thin-film transistor (TFT) used as the load device in the TFT SRAM of FIG. 6.
Figure 6E:
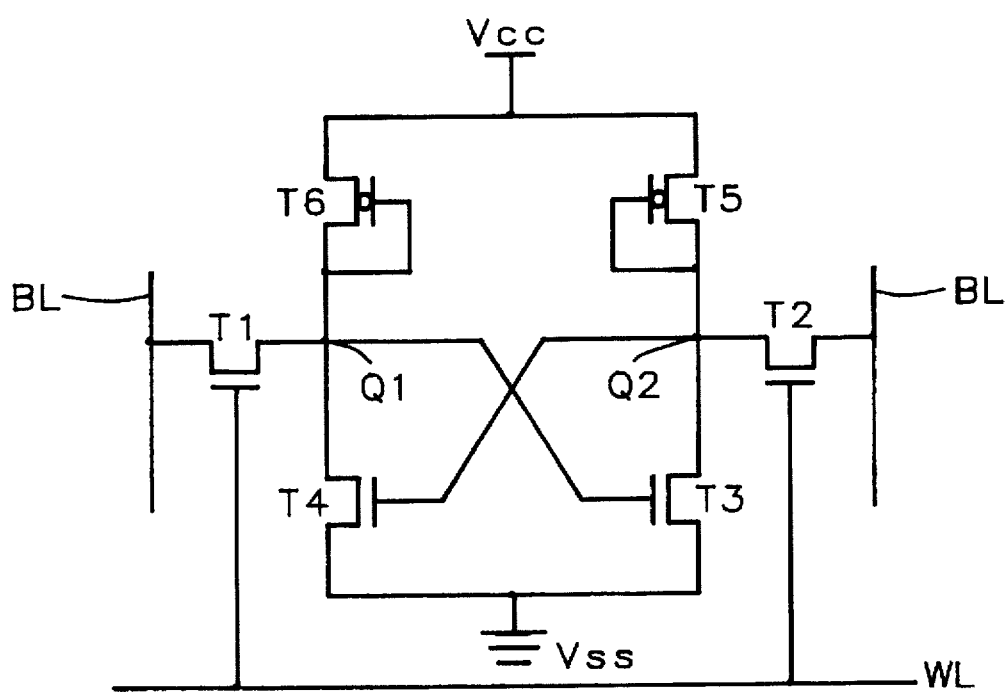
FIG. 6E is a schematic circuit diagram of a TFT-load SRAM of the invention.

Next the TFTs (Thin Film Transistors), which are to be used as the SRAM load devices, are created as described with reference to FIG. 6D. A thin third polysilicon layer (P3) 120 is deposited to a thickness of between about 300 and 500 Angstroms, over IPO-2 116, and doped either by ion implant or by diffusion of B (for a P+ gate) or phosphorus (N+ gate), after which it is patterned by conventional lithography and etching to form the TFT gate electrodes. Subsequently a high quality TFT gate oxide 121 is deposited to a thickness of between about 200 and 500 Angstroms. Any of various oxide processes could be used, including PETEOS, LPOX (Low Pressure Oxide), HTO or the like.

A second stacked contact 122 (SC2) is now formed, in the same way as SC1, to allow for the connection of the TFT source/drains (to-be-formed, poly-4) to the $V_{cc}$ contact structure and to the gate electrodes (P3) of the other TFT, as shown in FIG. 6C. The fourth polysilicon layer 124 (P4) is used at the stacked contact, as well as for a thin-film channel and source/drain for the TFTs. This layer is deposited to have a thickness of between about 100 and 500 Angstroms. The TFT S/D regions 126 are formed by ion implanting P4 in the desired pattern to form a low resistance connecting layer, with no implant in the desired channel region 127. An offset 129 is provided to allow better transistor leakage characteristics. Finally a P4 TFT channel etch 128 is used to define the poly-4 region and to form the TFT channel region. This completes the steps "E" shown in FIGS. 6A–6B for the TFT-load SRAM of the invention.

Figure 2E:
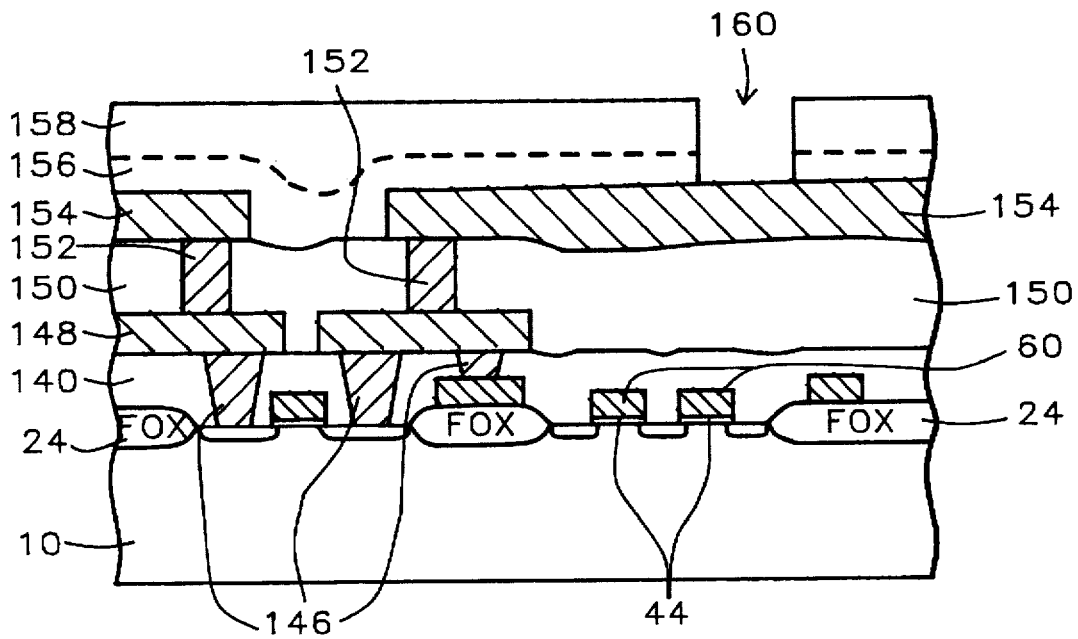
FIG. 2E is a cross-sectional representation of the latter stages of forming the blended logic/memory IC of the invention.

The final stages of IC processing, primarily metal interconnection of the devices formed, may now be performed, and are common to all device types on the blended IC. It is at this stage in processing that any connections desired between the logic and memory devices, or between the different types of memory devices, are made. Referring now to FIGS. 2 and 2E, interlevel dielectrics (ILD) 140 are formed, typically by deposition of an undoped oxide having a thickness of 500 to 3000 Angstroms, and a doped oxide, for example BPSG (borophosphosilicate glass), BPTEOS, or the like, to a thickness of between about 2000 and 8000 Angstroms. Planarization must then be performed, preferably by an etchback, as is known in the art. This is preferable to a re-flow of the oxide, which is performed at a temperature of between about 800° and 850° C. for about 60 minutes, but which may cause undesirable device shift in the logic devices. For advanced processes, the ILD etching back may be replaced by CMP (chemical mechanical polishing), which also avoids high-temperature processing, in which case the ILD is formed at an initially greater thickness of between about 25000 and 30000 Angstroms.

Contact openings 142 are now formed in the ILD 140 dielectric to open a contact region for connection of metal interconnects to the underlying substrate, or to polysilicon structures previously formed. Back-end processing 144 then takes place. The example shown in FIG. 2E assumes two levels of metal, but additional metal layers may also be used. Metal plugs 146 formed of, for example, W (tungsten) are used in the contact openings, in which tungsten is deposited by CVD and then etched back for plug formation. A metal layer 148 formed of, for example, an AlSiCu (aluminum silicon copper) composite, is deposited and patterned in the desired pattern to connect to W plugs 146.

An intermetal dielectric (IMD) 150 is next deposited, of the same materials and in the same way as ILD 140, and etched back, and separates the first and second metal. Vias 152 are formed in the IMD, and the vias are filled in a similar manner as the contacts 146, with W plugs or the like. A second metal layer 154 is then deposited and patterned to connect to metal-1 through the vias. A passivation layer is formed to seal the metal lines, and consists of an oxide 156 and a nitride 158. Lastly, pad openings 160 are formed in the passivation layer for formation of IC pads to provide external connections to and from the blended IC of the invention.

Beside the different process steps used in processing logic and memory devices that have been integrated by the method of the invention, there are other differences between logic and memory processing that are addressed by the invention. For example, differences in thermal cycle requirements could cause different channel profiles and source/drain junction depths, resulting in transistor performance differences between logic and memory devices. In the method of the invention, however, starting from well drive-in and including gate oxide formation, S/D anneal, all thermal cycles are identical for both processes. Additional thermal cycles unique to particular memory devices use a lower temperature or alternate processes, such as etch back or CMP for ILD and IMD planarization, or a shorter time, to minimize impact to the logic.

A second obstacle to blending logic and memory devices is that the EEPROM and DRAM may require a substrate back bias $V_{bb}$, as well as on-chip voltage generators such as high-voltage generator $V_{pp}$ for the EEPROM high voltage transistor, and on-chip $V_{cc}$ and $V_{wl}$ for the DRAM. For an EEPROM, a back bias may be used to reduce field device leakage. Since an EEPROM normally requires a high voltage for programming and erasure, field device leakage is a concern. By applying back-bias, the field transistor threshold can be significantly increased.

For DRAMs, a back-bias is always required, since otherwise minority carriers (positive charges) generated by hot electrons will flow to the capacitor storage node and destroy the stored signal. A substrate back bias $V_{bb}$ collects minority carriers and insures charge retention.

To provide the various above biases on the memory devices of the invention, a triple-well approach, as described with reference to FIGS. 2A–2D, is used so that biased circuitry can be attached at the desired locations in the triple-well. For example, if logic and DRAM are desired to be formed on the same IC, the logic and DRAM peripheral circuitry are formed in N-well and P-well regions 12 and 14 as depicted in FIG. 2D. The DRAM cell is formed in region 16 (P-well in N-well) and the voltage back bias is connected to the substrate in P-well 25.

Figure 7:
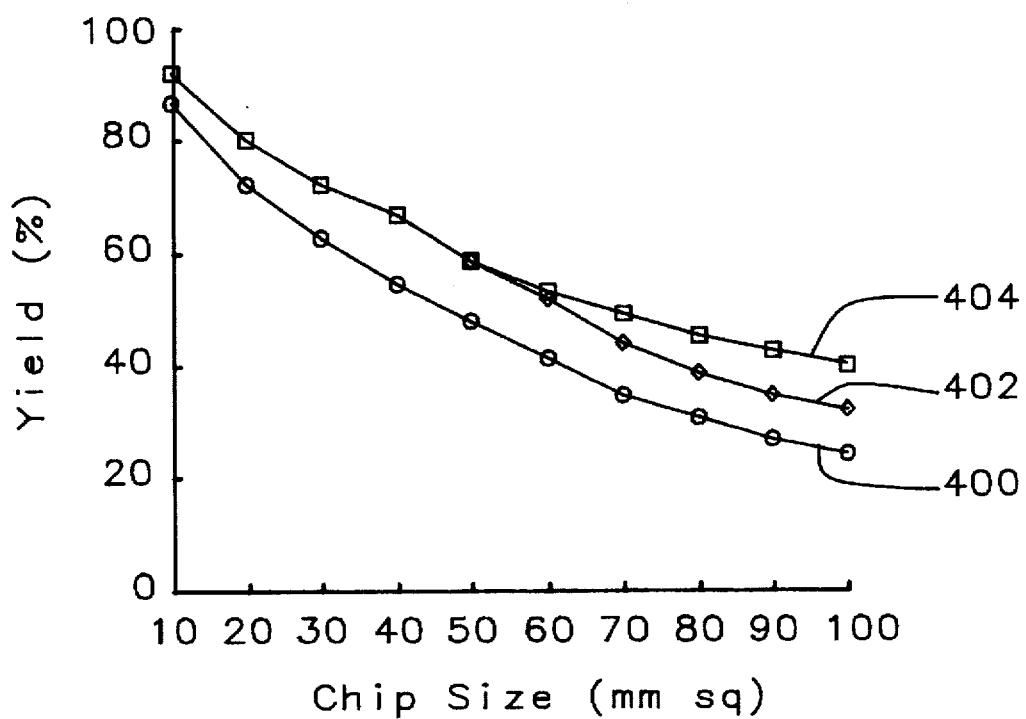
FIG. 7 is a graphical depiction of the manufacturing yields that may be derived from the separate formation of logic and memory devices of the prior art, and the combined process of the invention.

An advantage of the method of the invention is the yield improvement that can be achieved as depicted in FIG. 7, in which yield is shown as a function of chip size in square millimeters (mm. sq.). Memory yield curve 400 is lower due to the generally higher defect density of memory products, which require more masking layers. The embedded product yield 402 falls between the memory yield 400 and logic yield 404. Given an intermediate yield and the greater value of each embedded part to an IC developer, it would be beneficial to the manufacturer of the embedded part to produce them.

While the invention has been particularly shown and described with reference to the preferred embodiments thereof, it will be understood by those skilled in the art that various changes in form and details may be made without departing from the spirit and scope of the invention.

What is claimed is:

1. A method of forming semiconductor logic devices and memory devices on a single semiconductor substrate, in a logic region and memory region, respectively, comprising the steps of:

providing a semiconductor substrate having a first conductivity type dopant;

forming a triple-well structure in said semiconductor substrate, having N-well regions, P-well regions, and P-well in N-well regions;

forming field isolation regions in said semiconductor substrate, in both said logic and memory regions;

forming a cell for said memory device in said P-well in N-well region of said memory region;

performing a channel implant in said substrate for each of said logic and memory devices;

forming a primary gate oxide over said substrate for each of said logic and memory devices;

forming a gate over each said primary gate oxide;

forming lightly doped drain (LDD) regions in said substrate, using said gate as a mask;

forming sidewall spacers on the vertical sides of each said gate;

forming heavily doped source and drain regions adjacent to said LDD regions, using said gate and said sidewall spacers as a mask;

forming an inter-level dielectric layer over said logic and memory devices;

forming contact openings in said inter-level dielectric layer over contact regions of said logic and memory devices;

depositing a metal layer over said inter-level dielectric layer and in said openings to make contact to said contact regions; and completing said memory and logic devices.

2. The method of claim 1 wherein said channel implant is performed using boron fluoride $BF_2$ at a dosage of between about 1 E 12 and 1 E 13 atoms/cm.$^2$ and an energy of between about 30 and 60 KeV.

3. The method of claim 1 wherein said primary gate oxide is thermally grown to a thickness of between about 60 and 150 Angstroms.

4. The method of claim 1 wherein said forming an interlevel dielectric layer comprises the steps of:

depositing an undoped oxide having a thickness of between about 500 to 3000 Angstroms over said logic and memory regions;

depositing a doped oxide, over said undoped oxide; and planarizing said interlevel dielectric.

5. The method of claim 4 wherein said undoped and doped oxides are formed to a combined thickness of between about 25000 and 30000 Angstroms, and said planarizing is accomplished by chemical/mechanical planarization.

6. The method of claim 1 wherein said memory devices comprise an Electrically Eraseable Programmable Read Only Memory (EEPROM).

7. The method of claim 6 wherein said EEPROM is a single-poly EEPROM having a tunnel region, a control gate region, a high-voltage transistor region and a low-voltage transistor region, wherein said forming a cell comprises the steps of:

performing a cell tunnel ion implant in said control gate region and in a portion of said tunnel region, in said substrate;

forming a first gate oxide over said substrate in said memory region;

after said performing a channel implant, removing said first gate oxide in said control gate and said low-voltage transistor regions;

forming a second gate oxide over said substrate in said control gate and said low-voltage transistor regions, simultaneously with said forming a primary gate oxide;

performing a deep ion implant in said substrate in said low voltage transistor region;

forming a tunnel oxide window in said first gate oxide, over said portion of said tunnel region in which a cell tunnel ion implant was performed;

forming a tunnel oxide in said tunnel oxide window;

forming a floating gate over said tunnel oxide window and a portion of said tunnel region adjacent to said tunnel window, and over said control gate region, simultaneously with said forming a gate; and performing a double-diffused ion implant in said low-voltage transistor region.

8. The method of claim 7 wherein said cell tunnel ion implant is performed using phosphorus $P^{31}$ implanted at a dosage of between about 1 E 13 and 5 E 14 atoms/cm.$^2$ and an energy of between about 80 and 200 KeV.

9. The method of claim 7 whereby said first gate oxide has a resultant thickness in said tunnel region and said high-voltage transistor region of about 180 Angstroms, and a thickness of about 120 Angstroms in said control gate region and said low-voltage transistor region.

10. The method of claim 7 wherein said deep ion implant is performed using boron ions at a dosage of between about 1 E 11 and 5 E 12 atoms/cm.$^2$ and at an energy of between about 50 and 150 KeV.

11. The method of claim 7 wherein said tunnel oxide is formed by thermal growth at a temperature of between about 800° and 1150° C. in a diluted $O_2$ ambient, having a resultant thickness of between about 65 and 120 Angstroms.

12. The method of claim 7 wherein said double-diffused ion implant comprises the steps of:

implanting phosphorus ions at a dosage of between about 1 E 14 and 2 E 15 atoms/cm.$^2$ at an energy of between about 20 and 100 KeV; and implanting arsenic ions at a dosage of between about 1 E 14 and 2 E 15 atoms/cm.$^2$ at an energy of between about 20 and 100 KeV.

13. The method of claim 6 wherein said EEPROM is a double-poly EEPROM, having a tunnel region, a high-voltage transistor region and a low-voltage transistor region, wherein said forming a cell comprises the steps of:

performing a cell tunnel ion implant in a portion of said tunnel region, in said substrate;

forming a first gate oxide over said substrate in said memory region, simultaneously with said forming a primary gate oxide;

forming a tunnel oxide window in said first gate oxide, over said portion of said tunnel region in which a cell tunnel ion implant was performed;

forming a tunnel oxide in said tunnel oxide window;

forming a floating gate over said tunnel oxide window and a portion of said tunnel region adjacent to said tunnel window, simultaneously with said forming a gate;

forming an interpoly dielectric over said floating gate; and forming a control gate over said interpoly dielectric.

14. The method of claim 13 wherein said cell tunnel ion implant is performed using phosphorus $P^{31}$ implanted at a dosage of between about 1 E 13 and 5 E 14 atoms/cm.$^2$ and an energy of between about 80 and 200 KeV.

15. The method of claim 13 wherein said tunnel oxide is formed by thermal growth at a temperature of between about 800° and 1150° C. in a diluted $O_2$ ambient, having a resultant thickness of between about 65 and 120 Angstroms.

16. The method of claim 13 wherein said forming an interpoly dielectric comprises the steps of:
- thermally growing a first layer of silicon oxide over said tunnel region to a thickness of between about 50 and 200 Angstroms;
- depositing a layer of silicon nitride over said first layer of silicon oxide having a thickness of between about 100 and 300 Angstroms; and
- depositing a layer of silicon oxide to a thickness of between about 10 and 50 Angstroms.

17. The method of claim 13 wherein said control gate is formed of doped polysilicon.

18. The method of claim 1 wherein said memory devices comprise a poly-load Static Random Access Memory (SRAM), having first and second access transistors, first and second drive transistors, and first and second load resistors.

19. The method of claim 18 wherein said forming a cell comprises the steps of:
- performing a cell ion implant in said memory region in said substrate, whereby the cell transistor threshold voltage is raised;
- forming a buried contact in said memory region, comprising the steps of:
  - forming a first layer of polysilicon over said field isolation regions and over said primary gate oxide, in said memory region;
  - forming a buried contact opening in said first layer of polysilicon and said primary gate oxide, adjacent to one of said field isolation regions;
  - implanting a conductivity imparting dopant in said substrate through said buried contact opening;
  - depositing a second layer of polysilicon over said field isolation regions, said buried contact opening and said first layer of polysilicon;
  - patterning said second layer of polysilicon, said first layer of polysilicon and said primary gate oxide to form gate electrodes for said SRAM access and load transistors, and to connect said buried contact to said SRAM drive transistors;
- after said forming heavily doped source and drain regions, forming an interpoly oxide over said SRAM access and drive transistors and over said substrate in said memory region;
- forming an opening in said interpoly dielectric over said buried contact opening;
- depositing a third layer of polysilicon over said memory region, whereby said third layer of polysilicon forms a stacked contact to said second layer of polysilicon through said opening in said interpoly dielectric;
- forming load resistors for said SRAM, connected to said buried contact, by ion implanting a first portion of said third layer of polysilicon; and
- forming a $V_{cc}$ interconnection connected to said resistors, by ion implanting a second portion of said third layer of polysilicon.

20. The method of claim 19 wherein said cell ion implant is performed using dopant ions selected from the group consisting of boron (B) and boron fluoride ($BF_2$), implanted at a dosage of between about 5 E 11 and 5 E 13 atoms/cm.$^2$ and an energy of between about 10 and 80 KeV.

21. The method of claim 19 wherein said implanting a conductivity imparting dopant in said substrate through said buried contact opening comprises implanting phosphorus or arsenic at a dosage of between about 1 E 14 and 5 E 15 atoms/cm.$^2$ and at an energy of between about 20 and 100 KeV.

22. The method of claim 19 wherein said patterning of said second layer of polysilicon is performed simultaneously with said forming a gate.

23. The method of claim 19 wherein said forming resistors comprises implanting ions selected from the group consisting of boron, arsenic and phosphorus at a dosage of between about 1 E 12 and 1 E 13 atoms/cm.$_2$ and an energy of between about 10 and 50 KeV.

24. The method of claim 19 wherein said forming a $V_{cc}$ interconnection comprises implanting ions selected from the group consisting of arsenic and phosphorus at a dosage of between about 1 E 15 and 5 E 15 atoms/cm.$_2$ and an energy of between about 10 and 50 KeV.

25. The method of claim 1 wherein said memory devices comprise a Dynamic Random Access Memory (DRAM).

26. The method of claim 25 wherein said DRAM has a field effect transistor (FET) and a capacitor, and said forming a cell comprises the steps of:
- performing a cell tunnel ion implant in said memory region;
- forming an interpoly oxide over said memory region, after said forming heavily doped source and drain regions;
- forming capacitor contact openings in said interpoly oxide over to one of said heavily doped drain region of said FET;
- forming a polysilicon capacitor bottom electrode in each said capacitor contact opening;
- forming a capacitor dielectric layer over each said polysilicon capacitor bottom electrode;
- forming a polysilicon capacitor top electrode over each said capacitor dielectric layer;
- forming an inter-level dielectric layer over said memory region;
- forming bit-line contact openings to said heavily doped source region of said FET, in said inter-level dielectric layer; and
- forming polysilicon bit-lines over said memory region and in said contact openings.

27. The method of claim 26 wherein said polysilicon capacitor bottom electrode is formed to a thickness of between about 1000 and 5000 Angstroms.

28. The method of claim 27 wherein said capacitor dielectric layer is formed of an oxide-nitride-oxide sandwich structure having a thickness of between about 40 and 100 Angstroms.

29. The method of claim 1 wherein said memory devices comprise a TFT-load Static Random Access Memory (SRAM), having first and second access transistors, first and second drive transistors, first and second TFT load transistors, and first and second bit-line connections.

30. The method of claim 29 wherein said forming a cell comprises the steps of:
- performing a cell ion implant in said memory region in said substrate, whereby the cell transistor threshold voltage is raised;
- forming a buried contact in said memory region, comprising the steps of:
  - forming a mask layer of polysilicon over said field isolation regions and over said primary gate oxide, in said memory region;
  - forming a buried contact opening in said first layer of polysilicon and said primary gate oxide, adjacent to one of said field isolation regions;
  - implanting a conductivity imparting dopant in said substrate through said buried contact opening;

depositing a first layer of polysilicon over said field isolation regions, said buried contact opening and said first layer of polysilicon;

patterning said first layer of polysilicon, said mask layer of polysilicon and said primary gate oxide to form gate electrodes for said SRAM access and TFT load transistors, and to connect said buried contact to said SRAM drive transistors;

after said forming heavily doped source and drain regions, forming an interpoly oxide over said memory region;

forming a second buried contact at said bit-line connections to said first and second access transistors, including the step of depositing and patterning a second layer of polysilicon;

forming a second interpoly oxide over said memory region;

forming stacked contact openings in said second interpoly oxide over the gates of said first and second access transistors and said first and second TFT load transistors;

depositing a third layer of polysilicon over said memory region, and patterning said third layer of polysilicon to form gates for said TFT load transistors, and to connect said gates for said first and second TFT load transistors through said stacked contact openings to said first and second load transistor, respectively;

forming a TFT gate oxide over said gates for said TFT load transistors;

depositing a fourth layer of polysilicon over said TFT gate oxide and over said second interpoly oxide;

patterning said fourth layer of polysilicon whereby a first channel layer of polysilicon remains over said first TFT load transistor connected to the gate of said second TFT load transistor, and whereby a second channel layer of polysilicon remains over said second TFT load transistor connected to the gate of said first TFT load transistor; and implanting a portion of said first and second channel layers of polysilicon, adjacent to said TFT gates, and on one side of said TFT gate partially over said TFT gate, to form source/drain electrodes for said TFT load transistors, whereby an unimplanted region of said second channel layers of polysilicon is a TFT channel.

31. The method of claim 30 wherein said cell ion implant is performed using dopant ions selected from the group consisting of boron (B) and boron fluoride (BF$_2$), implanted at a dosage of between about 5 E 11 and 5 E 13 atoms/cm$^2$ and an energy of between about 10 and 80 KeV.

32. The method of claim 30 wherein said implanting a conductivity imparting dopant in said substrate through said buried contact opening comprises implanting phosphorus or arsenic at a dosage of between about 1 E 14 and 5 E 15 atoms/cm$^2$ and at an energy of between about 20 and 100 KeV.

33. The method of claim 30 wherein said third layer of polysilicon is deposited to a thickness of between about 300 and 500 Angstroms.

34. A method of forming logic and memory devices in the same semiconductor substrate using a triple-well structure having N-well regions, P-well regions, and a P-well-in-N-well regions, comprising the steps of:

doping said substrate by ion implanting a first conductivity-imparting dopant;

ion implanting a second conductivity-imparting dopant into said N-well and P-well-in-N-well regions;

forming a first insulating layer over said substrate;

forming a second insulating layer over said first insulating layer;

forming openings in said first and second insulating layers by patterning said first and second insulating layers to expose regions of said substrate in which field isolation regions are desired to be formed;

forming field isolation regions in said openings;

removing said first and second insulating layers;

ion implanting a third conductivity-imparting dopant in said P-well and said P-well-in-N-well regions;

driving in said first, second and third-conductivity-imparting dopants by heating said substrate to a temperature of between about 900° and 1200° C.;

forming said logic devices in said N-well regions and said P-well regions; and forming said memory devices in said P-well-in-N-well regions.

35. The method of claim 34 wherein said doping said substrate is accomplished by ion implanting boron at a concentration of between about 1 E 12 and 1 E 14 atoms/cm$^2$ and an energy of between about 100 and 500 KeV.

36. The method of claim 34 wherein said second conductivity-imparting dopant is phosphorus, implanted at an energy of between about 120 and 200 KeV. and at a dosage of between about 5 E 12 and 5 E 13 atoms/cm$^2$.

37. The method of claim 36 wherein said second conductivity-imparting dopant is driven in by heating said substrate in in N$_2$ (nitrogen) or diluted O$_2$ (oxygen) ambient, for between about 5 and 20 hours, and at a temperature of between about 1000° and 1200° C.

38. The method of claim 34 wherein said first insulating layer is silicon oxide formed at a thickness of between about 100 to 300 Angstroms, grown thermally at a temperature of between about 800° and 1000° C.

39. The method of claim 34 wherein said second insulating layer is silicon nitride (Si$_3$N$_4$) formed to a thickness of between about 1000 and 2000 Angstroms.

40. The method of claim 34 wherein said field isolation regions are formed by heating said substrate in steam or dry oxygen (O$_2$) for between about 30 and 250 minutes and at a temperature of between about 900° and 1200° C.

41. The method of claim 34 wherein said forming field isolation regions comprises the steps of:

etching cavities in said substrate through said openings by reactive ion etching;

depositing an oxide material in said cavities and over said second insulating layer; and etching back said oxide material whereby a top surface of said oxide material is planar with a top surface of said second insulating material.

42. The method of claim 34 wherein said third conductivity-imparting dopant comprises boron implanted at an energy of between about 100 and 150 KeV. and a dosage of between about 5 E 12 and 5 E 13 atoms/cm$^2$.

43. The method of claim 34 wherein said memory devices comprise a DRAM (Dynamic Random Access Memory) and a means for providing a voltage back-bias is connected to said P-well-in-N-well.

44. The method of claim 34 wherein said memory devices comprise a EEPROM (Electrically Eraseable Programmable Read Only Memory) and a means for providing a voltage back-bias is connected to said P-well-in-N-well.

45. A method of forming semiconductor logic devices and memory devices on a single semiconductor substrate, in a logic region and memory region, respectively, comprising the steps of:

providing a semiconductor substrate having a first conductivity type dopant;

forming a triple-well structure in said semiconductor substrate, having N-well regions, P-well regions, and P-well in N-well regions;

forming field isolation regions in said semiconductor substrate, in both said logic and memory regions;

forming a cell for said memory device in said P-well in N-well region of said memory region;

performing a channel implant in said substrate for each of said logic and memory devices;

forming a primary gate oxide over said substrate for each of said logic and memory devices;

forming a gate over each said primary gate oxide;

forming lightly doped drain (LDD) regions in said substrate, using said gate as a mask;

forming sidewall spacers on the vertical sides of each said gate;

forming heavily doped source and drain regions adjacent to said LDD regions, using said gate and said sidewall spacers as a mask;

forming an inter-level dielectric layer over said logic and memory devices;

forming contact openings in said inter-level dielectric layer over contact regions of said logic and memory devices;

depositing a metal layer over said inter-level dielectric layer and in said openings to make contact to said contact regions; and completing said memory and logic devices.

46. The method of claim 45 wherein said memory devices comprise a Dynamic Random Access Memory (DRAM).

47. The method of claim 46 wherein said DRAM has a field effect transistor (FET) and a capacitor, and said forming a cell comprises the steps of:

performing a cell tunnel ion implant in said memory region;

forming an interpoly oxide over said memory region, after said forming heavily doped source and drain regions;

forming capacitor contact openings in said interpoly oxide over to one of said heavily doped drain region of said FET;

forming a polysilicon capacitor bottom electrode in each said capacitor contact opening;

forming a capacitor dielectric layer over each said polysilicon capacitor bottom electrode;

forming a polysilicon capacitor top electrode over each said capacitor dielectric layer;

forming an inter-level dielectric layer over said memory region;

forming bit-line contact openings to said heavily doped source region of said FET, in said inter-level dielectric layer; and forming polysilicon bit-lines over said memory region and in said contact openings.

48. The method of claim 47 wherein said polysilicon capacitor bottom electrode is formed to a thickness of between about 1000 and 5000 Angstroms.

49. The method of claim 47 wherein said capacitor dielectric layer is formed of an oxide-nitride-oxide sandwich structure having a thickness of between about 40 and 100 Angstroms.

50. The method of claim 47 wherein said memory devices further comprise a Static Random Access Memory (SRAM).

51. The method of claim 50 wherein said SRAM is a poly-load type SRAM, having first and second access transistors, first and second drive transistors, and first and second load resistors.

52. The method of claim 51 wherein said forming a cell comprises the steps of:

performing a cell ion implant in said memory region in said substrate, whereby the cell transistor threshold voltage is raised;

forming a buried contact in said memory region, comprising the steps of:

forming a first layer of polysilicon over said field isolation regions and over said primary gate oxide, in said memory region;

forming a buried contact opening in said first layer of polysilicon and said primary gate oxide, adjacent to one of said field isolation regions;

implanting a conductivity imparting dopant in said substrate through said buried contact opening;

depositing a second layer of polysilicon over said field isolation regions, said buried contact opening and said first layer of polysilicon;

patterning said second layer of polysilicon, said first layer of polysilicon and said primary gate oxide to form gate electrodes for said SRAM access and load transistors, and to connect said buried contact to said SRAM drive transistors;

after said forming heavily doped source and drain regions, forming an interpoly oxide over said SRAM access and drive transistors and over said substrate in said memory region;

forming an opening in said interpoly dielectric over said buried contact opening;

depositing a third layer of polysilicon over said memory region, whereby said third layer of polysilicon forms a stacked contact to said second layer of polysilicon through said opening in said interpoly dielectric;

forming load resistors for said SRAM, connected to said buried contact, by ion implanting a first portion of said third layer of polysilicon; and forming a $V_{cc}$ interconnection connected to said resistors, by ion implanting a second portion of said third layer of polysilicon.

53. The method of claim 52 wherein said patterning of said second layer of polysilicon is performed simultaneously with said forming a gate.

54. The method of claim 50 wherein said SRAM is a TFT-load SRAM, having first and second access transistors, first and second drive transistors, first and second TFT load transistors, and first and second bit-line connections.

55. The method of claim 54 wherein said forming a cell comprises the steps of:

performing a cell ion implant in said memory region in said substrate, whereby the cell transistor threshold voltage is raised;

forming a buried contact in said memory region, comprising the steps of:

forming a mask layer of polysilicon over said field isolation regions and over said primary gate oxide, in said memory region;

forming a buried contact opening in said first layer of polysilicon and said primary gate oxide, adjacent to one of said field isolation regions;

implanting a conductivity imparting dopant in said substrate through said buried contact opening;

depositing a first layer of polysilicon over said field isolation regions, said buried contact opening and said first layer of polysilicon;

patterning said first layer of polysilicon, said mask layer of polysilicon and said primary gate oxide to form gate electrodes for said SRAM access and TFT load transistors, and to connect said buried contact to said SRAM drive transistors;

after said forming heavily doped source and drain regions, forming an interpoly oxide over said memory region;

forming a second buried contact at said bit-line connections to said first and second access transistors, including the step of depositing and patterning a second layer of polysilicon;

forming a second interpoly oxide over said memory region;

forming stacked contact openings in said second interpoly oxide over the gates of said first and second access transistors and said first and second TFT load transistors;

depositing a third layer of polysilicon over said memory region, and patterning said third layer of polysilicon to form gates for said TFT load transistors, and to connect said gates for said first and second TFT load transistors through said stacked contact openings to said first and second load transistor, respectively;

forming a TFT gate oxide over said gates for said TFT load transistors;

depositing a fourth layer of polysilicon over said TFT gate oxide and over said second interpoly oxide;

patterning said fourth layer of polysilicon whereby a first channel layer of polysilicon remains over said first TFT load transistor connected to the gate of said second TFT load transistor, and whereby a second channel layer of polysilicon remains over said second TFT load transistor connected to the gate of said first TFT load transistor; and implanting a portion of said first and second channel layers of polysilicon, adjacent to said TFT gates, and on one side of said TFT gate partially over said TFT gate, to form source/drain electrodes for said TFT load transistors, whereby an unimplanted region of said second channel layers of polysilicon is a TFT channel.

* * * * *